United States Patent
Hori et al.

(10) Patent No.: US 6,637,003 B1
(45) Date of Patent: Oct. 21, 2003

(54) VITERBI DECODER AND SYNCHRONISM CONTROLLING METHOD

(75) Inventors: Michiru Hori, Tokyo (JP); Hirohisa Machida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 473 days.

(21) Appl. No.: 09/704,797

(22) Filed: Nov. 3, 2000

(30) Foreign Application Priority Data

Dec. 16, 1999 (JP) .......................................... 11-357269

(51) Int. Cl.[7] .............................................. H03M 13/03
(52) U.S. Cl. ...................................... 714/795; 714/704
(58) Field of Search .............................. 714/760, 795, 714/798, 704, 707

(56) References Cited

U.S. PATENT DOCUMENTS 5,892,464 A * 4/1999 St. John et al.

FOREIGN PATENT DOCUMENTS

| JP | 61-135234 | 6/1986 |
| JP | 4-105426 | 4/1992 |
| JP | 10-190484 | 7/1998 |

\* cited by examiner

*Primary Examiner*—Phung M. Chung
(74) *Attorney, Agent, or Firm*—Leydig, Voit & Mayer, Ltd.

(57) ABSTRACT

A viterbi decoder includes a viterbi decoding section which decodes input data, and a coding unit which codes the data decoded by the decoding unit. The number of bit error corrections in the output of the coding unit during a measurement period which is set externally are detected. Further, a synchronized state is detected based on the detected number of bit error corrections and a threshold. A threshold detecting unit detects the threshold from the detected number of bit error corrections during a threshold detection period that includes the measurement period.

10 Claims, 13 Drawing Sheets

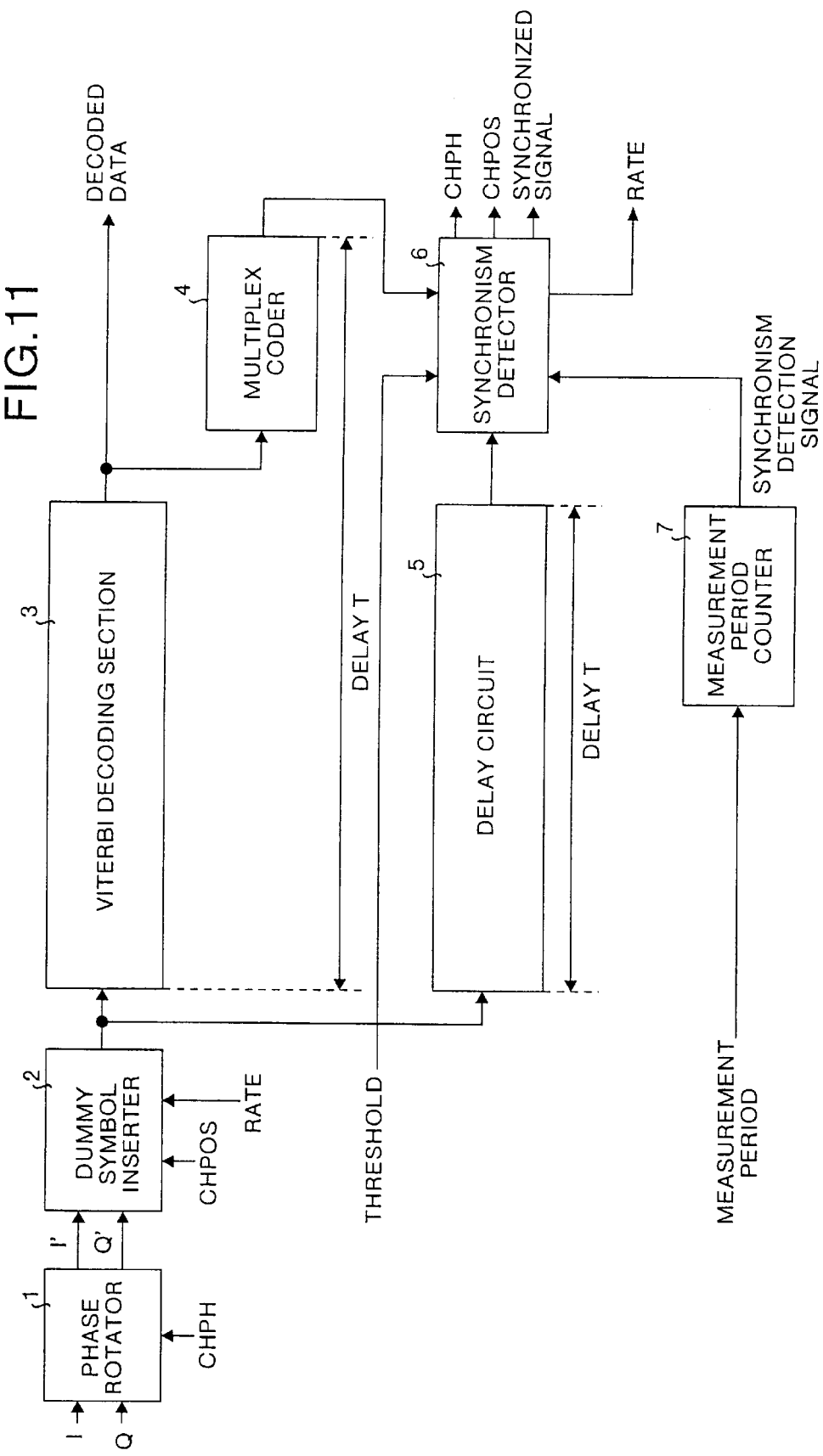

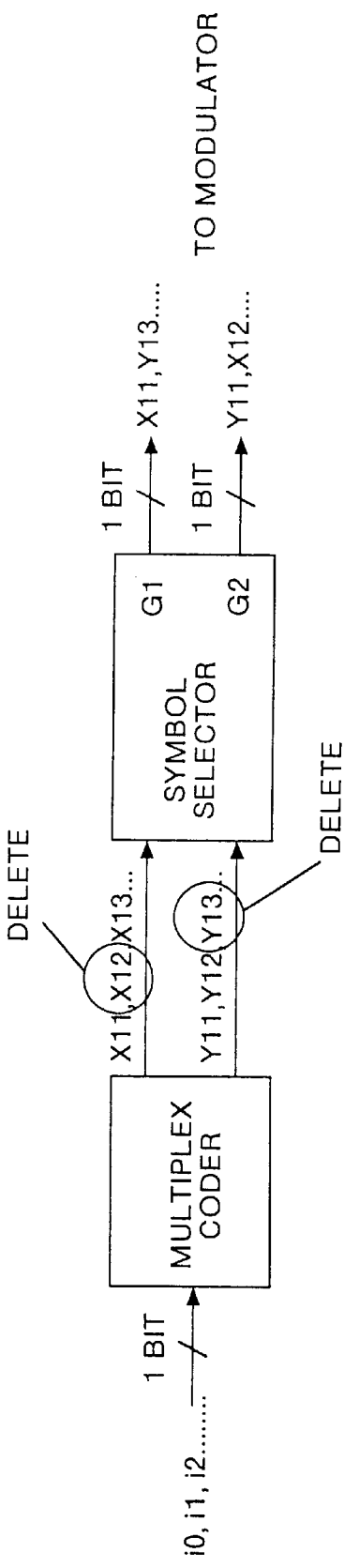

| | FIG.13A | | | FIG.13B | | | FIG.13C | | | FIG.13D | |
|---|---|---|---|---|---|---|---|---|---|---|---|
| X11 | Y11 | | Y11 | X11 | | Y12 | X13 | | X13 | Y12 | |
| 00 | Y12 | | 00 | X13 | | 00 | X13 | | 00 | Y12 | |
| X13 | 00 | | Y12 | 00 | | X21 | 00 | | Y21 | 00 | |
| X21 | Y21 | | Y21 | X21 | | Y22 | X23 | | X23 | Y22 | |
| 00 | Y22 | | 00 | X23 | | 00 | X23 | | 00 | Y22 | |
| X23 | 00 | | Y22 | 00 | | X31 | 00 | | Y31 | 00 | |

VITERBI DECODER AND SYNCHRONISM CONTROLLING METHOD

FIELD OF THE INVENTION

The present invention relates to the synchronism control of a viterbi decoder.

BACKGROUND OF THE INVENTION

In recent years, data transmission by satellite communications and cable has been digitized. In such digitized data transmission, a punctured code is used to realize high-speed data transmission with high error correction capability in a limited frequency band.

On the transmitting side, in compliance with a fixed pattern from a code group of a multiplex code created at a coding rate 1/2, the code is deleted to create a punctured code at a coding rate of n/m (n<m), which is modulated by a digital modulator and transmitted to the receiving side.

On the receiving side, a signal which has been demodulated by a demodulator is error-corrected using a viterbi decoder and output.

The viterbi decoder corrects errors in the demodulated signal by inserting a dummy symbol into the signal output from the demodulator.

The viterbi decoder monitors the number of bits corrected by counting the number of bit errors corrected in a fixed period.

When the insertion position of the dummy symbol is incorrect, i.e. when there is asynchronism, the value of the bit error constant which is monitored by the viterbi decoder becomes large. On the other hand, when the insertion position of the dummy symbol is correct, i.e. when there is synchronism, the value of the bit error constant decreases.

The viterbi decoder determines whether there is asynchronism or synchronism by comparing the number of bit error corrections with a predetermined threshold.

The number of positions where the dummy symbols are inserted is determined based on the coding rate. The viterbi decoder searches for synchronism by shifting the positions in each measurement period and comparing the number of bit error corrections in each aspect with the threshold.

FIG. 12 shows a sequence for creating a punctured code having a coding rate of 3/4 used in QPSK, and FIG. 11 is a block diagram of a conventional viterbi decoder.

As shown in FIG. 12, the punctured code is created by a multiplex coder having a coding rate of 1/2 and a symbol selector.

When a one-bit information group, . . . , i0, i1, i2, . . . has been input into the multiplex coder, the multiplex coder outputs a two-bit coded group, . . . , (X11, Y11), (X12, Y12), (X13, Y13) . . .

The symbol selector outputs (X11, Y11), (X12, Y12), (X13, Y13) as one block after deleting the codes at predetermined positions.

FIG. 12 shows an example where the deleted pattern is (101, 110). As a consequence, (X11, Y11), (X12, Y12), (X13, Y13) becomes (X11, Y11), (Y13, X12), and this is output from the symbol selector to the modulator.

The conventional viterbi decoder comprises, as shown in FIG. 11, a phase rotator 1, a dummy symbol inserter 2, a viterbi decoding section 3, a multiplex coder 4, a delay circuit 5, a synchronism detector 6, and a measurement period counter 7.

The synchronism detector 6 outputs a phase changing signal CHPH to the phase rotator 1, and outputs a dummy symbol position changing signal CHPOS to the dummy symbol inserter 2.

These two signals adjust the positions at which the dummy symbols are to be inserted into the modulation signal.

The operation of each block of the viterbi decoder will be explained here.

The phase rotator 1 controls (I', Q')=(I, Q) when the phase changing signal CHPH is "0", and controls (I', Q')=(Q, −I) when the phase change signal CHPH is "1".

The dummy symbol inserter 2 changes the insertion position of the dummy symbol when the dummy symbol position changing signal CHPOS has charged.

As an example, FIG. 13A to FIG. 13D show the output of the dummy symbol inserter 2 when a punctured code at a coding rate of 3/4 has been transmitted.

When coding has-been carried out as explained above, the state in FIG. 13A is synchronized, but the states of FIG. 13B to FIG. 13D are asynchronized.

The viterbi decoding section 3 corrects errors in compliance with a viterbi algorithm based on the signal which is output from the dummy symbol inserter 2. The multiplex coder 4 codes the corrected output of the viterbi decoding section 3.

The delay circuit 5 delays the output of the dummy symbol inserter 2 by time T. This delay T is equal to the sum of the delay of the viterbi -decoding section 3 and the delay of the multiplex coder 4. When the output I and Q (omitted from the figure) of the demodulating section is an n-bit soft determining signal, the delay circuit 5 delays the MSB of I' and Q'.

The synchronism detector 6 compares the output of the delay circuit 5 with the output of the multiplex coder 4 and counts the number of bit error corrections. The synchronism detector 6 compares this number with an externally set threshold and determines whether the outputs are synchronized or asynchronized. That is, the synchronism detector 6 determines whether the dummy symbols have been inserted at the correct positions.

For example, for a demodulated signal at a coding rate of 3/4, the phase rotator 1 outputs (I', Q')=(I, Q), and the output of the dummy symbol inserting circuit is as shown in FIG. 13B. Therefore, synchronism is controlled in the following way when the viterbi decoder starts correcting errors.

1. First Measurement Period

The viterbi decoded result is determined as asynchronized when the output of the dummy symbol inserter 2 is in the state shown in FIG. 13B.

Synchronism is achieved by using the phase rotator 1 to control of (I', Q')=(I, −Q), or by changing the insertion position of the dummy symbol in the dummy symbol inserter 2.

When the insertion position of the dummy symbol has been changed, the input into the viterbi decoding section 3 changes from the states shown in FIG. 13B to that shown in FIG. 13D.

2. Second Measurement Period

The viterbi decoded result is determined as asynchronized when the output of the dummy symbol inserter 2 is in the state shown in FIG. 13B.

The dummy symbol inserter 2 controls of (I', Q')=(Q, −I). The input into the viterbi decoding section 3 changes from the state shown in FIG. 13B to that of FIG. 13C.

3. Third Measurement Period

The viterbi decoded result is determined as asynchronized when the output of the dummy symbol inserter 2 is in the state shown in FIG. 13C.

The phase rotator 1 maintains (I', Q')=(Q, −I) while the dummy symbol inserter 2 changes the insertion position of the dummy symbol. The input to the viterbi decoding section 3 changes from that shown in FIG. 13C to the one shown in FIG. 13A.

4. Fourth Measurement Period

When the output of the dummy symbol inserter 2 is in the state shown in FIG. 13A, the viterbi decoded result is determined as synchronized.

Viterbi decoding is performed while maintaining the states of the phase rotator 1 and the dummy symbol inserter 2.

When asynchronism is detected, the phase rotator 1 controls of (I', Q')=(I, Q) and the dummy symbol inserter 2 is returned to its-initial state prior to searching for synchronism.

The measurement period counter 7 controls the timing according to which the synchronism detector 6 compares the number of corrected bit errors with the threshold. The measurement period counter 7 is set externally.

In the synchronized state, a synchronism detecting signal is output to the synchronism detector 6 in each measurement period.

In the asynchronized state, a delay T is needed from the point where the output of the dummy symbol inserter 2 changes until a signal is input into the viterbi decoding section 3 and recorded.

In the asynchronized state, the measurement period counter 7 stops the time count during the period T from the change of the output of the dummy symbol inserter 2, and the synchronism detector 6 stops counting the number of bit error corrections.

When the coding rate changes on the transmission side, it is not possible to detect synchronism in the specified number of times by measuring the bits in an operation mode at a coding rate of 3/4. For this reason, the operating mode is changed at such times in order to detect synchronism.

Thus, two settings 'measurement period and threshold' are required to determine synchronism in the viterbi decoder. When the measurement period has been changed, the threshold must also be changed.

The threshold must be changed when the coding rate has a variable length even if the measurement period is the same. The threshold is reset each time the coding rate changes (the change in the coding rate can be detected when synchronism has not been detected over a specific time. Alternatively, a scaled threshold is created by scaling a fixed value in accordance with the coding rate.

SUMMARY OF THE INVENTION

It is an object of the present invention to provide a viterbi decoder and a method for controlling synchronism in which the threshold can be appropriately and easily set in accordance with a predetermined measurement period.

A viterbi decoder according to one aspect of the present invention comprises a decoding unit which decodes input data; a coding unit which codes the data decoded by the decoding unit; a bit error corrections detecting unit which detects the number of bit error corrections in the output of the coding unit during a measurement period set externally; a synchronized state detecting unit which detects a synchronized state based on the number of bit error corrections detected by the bit error corrections detecting unit and a threshold; and a threshold detecting unit which detects the threshold based on the number of bit error corrections detected by the bit error corrections detecting unit during a preset threshold detection period that includes the measurement period.

A viterbi decoder according to another aspect of the present invention comprises a decoding unit which decodes input data; a coding unit which codes the data decoded by the decoding unit; a bit error corrections detecting unit which detects the number of bit error corrections in the output of the coding unit during a measurement period set externally; a synchronized state detecting unit which detects a synchronized state based on the number of bit error corrections detected by the bit error corrections detecting unit and a threshold; and a threshold detecting unit which, when the number of synchronous states of the viterbi decoder is 1 and the number of asynchronous states is L, measures the number of bit error corrections (L+1) times during the measurement period prior to the synchronizing operation of the viterbi decoder, and detects the threshold based on the measured number (L+1) of bit error corrections detected by the bit error corrections detecting unit.

A viterbi decoder according to still another aspect of the present invention comprises a phase rotating unit which rotates the phase of input data; a dummy symbol inserting unit which inserts a dummy symbol into the output of the phase rotating unit; a viterbi decoding unit which decodes the output of the dummy symbol inserting unit; a coding unit which codes the data decoded by the decoding unit; a bit error corrections detecting unit which detects the number of bit error corrections in the output of the coding unit during a measurement period set externally; a synchronized state detecting unit which detects a synchronized state based on the number of bit error corrections detected by the bit error corrections detecting unit and a threshold; a state storing unit for storing a state of the dummy symbol inserting unit, wherein it being possible to shift immediately to a synchronized state when the state storing unit transmits data to the dummy symbol inserting unit after a threshold detection period.

A viterbi decoder according to still another aspect of the present invention comprises a decoding unit which decodes input data; a coding unit which codes the data decoded by the decoding unit; a bit error corrections detecting unit which detects the number of bit error corrections in the output of the coding unit during a measurement period set externally; a synchronized state detecting unit which detects a synchronized state based on the number of bit error corrections detected by the bit error corrections detecting unit and a threshold; and a threshold calculating unit having register(s) and adder(s) for calculating the threshold based on the value of the measurement period.

A viterbi decoder according to still another aspect of the present invention comprises a decoding unit which decodes input data; a coding unit which codes the data decoded by the decoding unit; a bit error corrections detecting unit which detects the number of bit error corrections in the output of the coding unit during a measurement period set externally; a synchronized state detecting unit which detects a synchronized state based on the number of bit error corrections detected by the bit error corrections detecting unit and a threshold; and a scaling unit which determines the threshold by setting a ratio between the measurement period and the threshold.

A method for controlling synchronism in a viterbi decoder, the viterbi decoder comprising a decoding unit which decodes input data, and a coding unit which codes the data decoded by the decoding unit, according to still another aspect of the present invention comprises the steps of detecting the number of bit error corrections in the output of the coding unit during a measurement period set externally; detecting a synchronized state based on the detected number of bit error corrections a threshold; and detecting the number of bit error corrections in the output of the coding unit during a pre-set threshold detection period that includes the measurement period, and then detecting the threshold based on these detected number of bit error corrections.

A method for controlling synchronism in a viterbi decoder, the viterbi decoder comprising a decoding unit which decodes input data, and a coding unit which codes the data decoded by the decoding unit, according to still another aspect of the present invention comprises the steps of detecting the number of bit error corrections in the output of the coding unit during a measurement period set externally; detecting a synchronized state based on the detected number of bit error corrections a threshold; wherein, when the number of synchronous states of the viterbi decoder is 1 and the number of asynchronous states is L, the number of bit error corrections is measured (L+1) times during the measurement period prior to the synchronizing operation of the viterbi decoder; and detecting the threshold based on the measured number (L+1) of bit error corrections.

A method for controlling synchronism in a viterbi decoder, the viterbi decoder comprising a phase rotating unit which rotates the phase of input data, a dummy symbol inserting unit which inserts a dummy symbol into the output of the phase rotating unit, a viterbi decoding unit which decodes the output of the dummy symbol inserting unit, and a coding unit which codes the data decoded by the decoding unit, according to still another aspect of the present invention comprises the steps of detecting the number of bit error corrections in the output of the coding unit during a measurement period set externally; detecting a synchronized state based on the number of bit error corrections detected by the bit error corrections detecting unit and a threshold; storing a state of the dummy symbol inserting unit; and making it possible to shift immediately to a synchronized state by transmitting the stored data regarding the state to the dummy symbol inserting unit after a threshold detection period.

A method for controlling synchronism in a viterbi decoder, the viterbi decoder comprising a decoding unit which decodes input data, and a coding unit which codes the data decoded by the decoding unit, according to still another aspect of the present invention comprises the steps of detecting the number of bit error corrections in the output of the coding unit during a measurement period set externally; detecting a synchronized state based on the number of bit error corrections detected by the bit error corrections detecting unit and a threshold; calculating the threshold based on a value of the measurement period.

A method for controlling synchronism in a viterbi decoder, the viterbi decoder comprising a decoding unit which decodes input data, and a coding unit which codes the data decoded by the decoding unit, according to still another aspect of the present invention comprises the steps of detecting the number of bit error corrections in the output of the coding unit during a measurement period set externally; detecting a synchronized state based on the number of bit error corrections detected by the bit error corrections detecting unit and a threshold; determining the threshold by setting a ratio between the measurement period and the threshold as the scaling value.

Other objects and features of this invention will become apparent from the following description with reference to the accompanying drawings.

BRIEF DESCRIPTION OF THE DRAWINGS

FIG. 11 is a block diagram showing a conventional decoder;

FIG. 12 is a block diagram showing a sequence of creating a punctured code; and

FIG. 13 is a diagram showing the output of a dummy symbol inserter.

DESCRIPTION OF THE PREFERRED EMBODIMENTS

A first embodiment of this invention will be explained with reference to FIG. 1. Same legends are provided to same or similar sections in all the figures.

Figure 1:
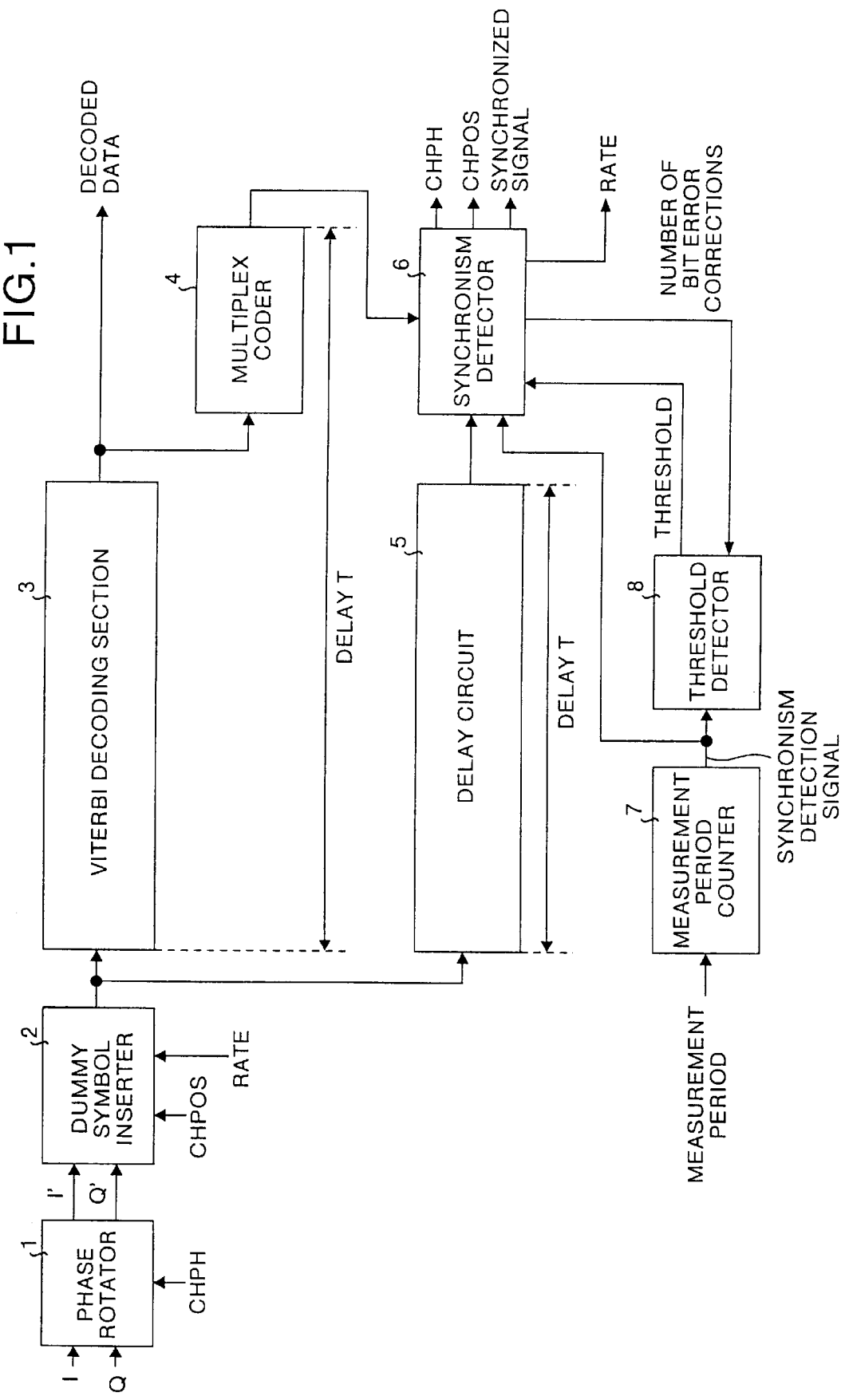
FIG. 1 is a block diagram showing the constitution of a first embodiment of this invention.

FIG. 1 shows the constitution of a viterbi decoder in a first embodiment of this invention.

The phase rotator 1 corresponds to the a phase rotating unit, the dummy symbol inserter 2 corresponds to the dummy symbol inserting unit, the viterbi decoding section 3 corresponds to the decoding unit, the multiplex coder 4 corresponds to the coding unit, the delay circuit 5 corresponds to the delaying unit, the synchronism detector 6 corresponds to the synchronism detecting unit, the measurement period counter 7 corresponds to the measurement period countering unit, and a threshold detector 8 corresponds to the threshold detecting unit.

The constitution and operation of the viterbi decoder according to the first embodiment are identical to those of the conventional example shown in FIG. 11, with the exception are the functions of the threshold detector 8 and the synchronism detector 6.

A not shown QPSK demodulator inputs in-phase channel data I and quadrature-phase channel data Q to the phase rotator 1.

The phase rotator 1 processes the input data I and Q and outputs them as data I'=−I and Q'=Q when the phase rotating signal CHPH is "1", and as data I'=I and Q'=Q when the phase rotating signal CHPH is "0".

The dummy symbol inserter 2 changes the dummy symbol insertion position of the signals I' and Q' output from the phase rotator 1 in accordance with the change in the dummy symbol position changing signal CHPOS, and inputs the result to the viterbi decoding section 3.

The viterbi decoding section 3 decodes the data input thereto and outputs it as decoded data. In addition, the multiplex coder 4 codes the data and inputs the coded data to the synchronism detector 6.

Furthermore, the output of the dummy symbol inserter 2 is input into the synchronism detector 6 via the delay circuit 5 which has a delay T corresponding to the signal delay T from the input of the viterbi decoding section 3 to the output of the multiplex coder 4.

Prior to the synchronous operation of the viterbi decoder, the synchronism detector 6 repeatedly measures the number of bit error corrections in each externally set measurement period (L+1) times when the number of synchronisms of the viterbi decoder to the code which has been coded by the multiplex coder 4 is 1 and the number of asynchronisms thereto is L.

The synchronism detector 6 distinguishes between the threshold detection period and the synchronism detection period by counting the number of synchronism detection signals.

The threshold detection period is the period when the synchronism detection signal is less than (L+1). During the threshold detection period, the synchronism detector 6 does not compare the number of bit error corrections with the threshold even when the synchronism detection signal is input thereto.

The synchronism detection period is the period when the synchronism detection signal is equal to or greater than (L+1). During the synchronism detection period, the synchronism detector 6 compares the threshold with the number of bit error corrections each time a synchronism detection signal is input thereto.

The counter of the synchronism detector 6 which counts the internal synchronism detection signals is set so as to be able to measure up to 2×L. In the case where no synchronism signals are detected up to 2×L, the synchronism detector 6 initializes the counter number and starts detecting the threshold.

The threshold detector 8 extracts the number of bit error corrections output from the synchronism detector 6 each time a synchronism detection signal is input thereto.

When the number of detected synchronism detection signals reaches L, the threshold detector 8 enters a mode of determining the threshold. The threshold need only be determined before the subsequent synchronism detection signal is input.

Figure 10:
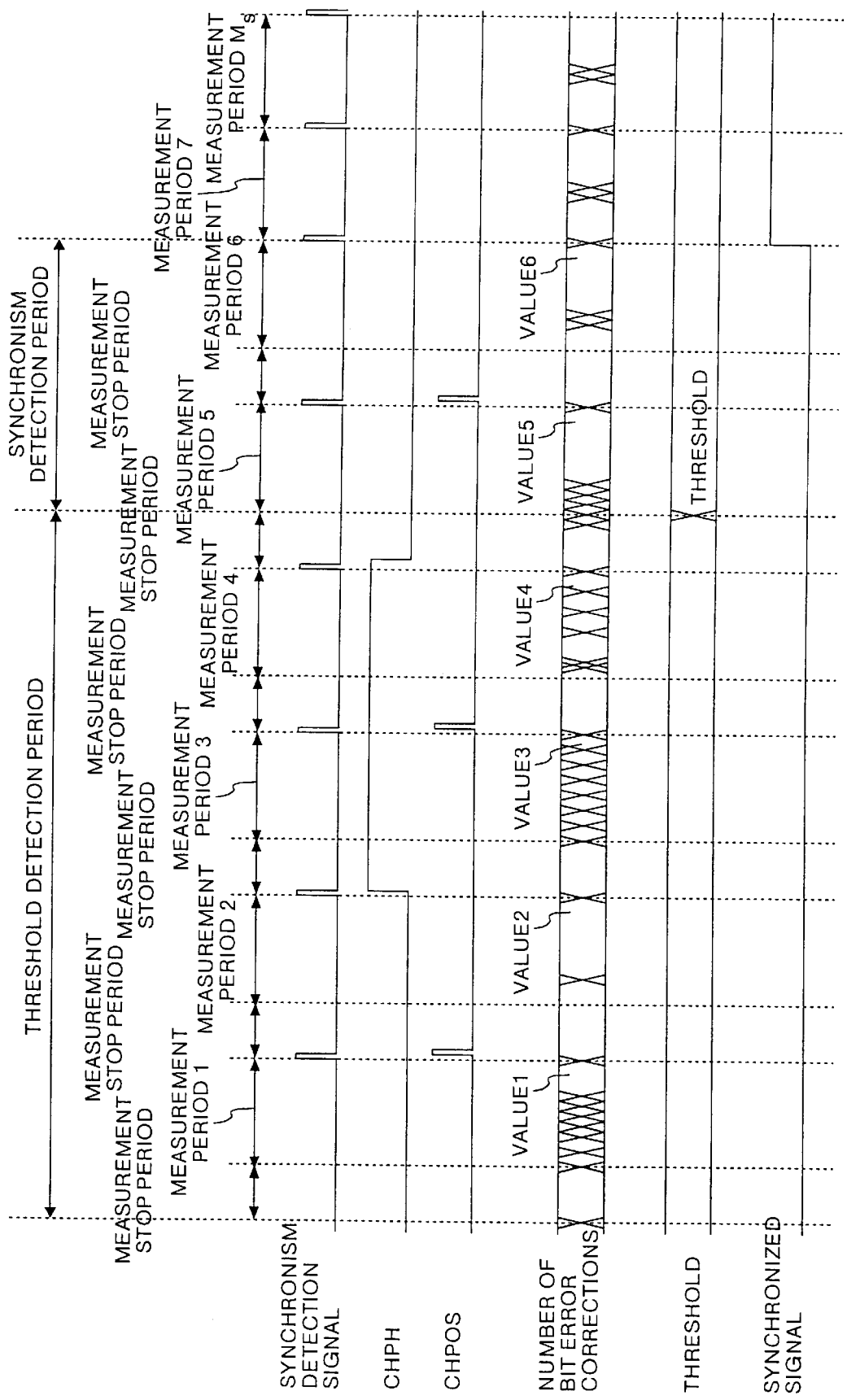
FIG. 10 is a timing chart showing the operation in the first embodiment of this invention.

FIG. 10 shows a timing chart of a bit line selecting unit at a coding rate of 3/4 when the first embodiment is used.

At the coding rate of 3/4, the number of synchronisms is 1 and the number of asynchronisms is 3. The number of bit error corrections is measured four times.

The synchronism detector 6 stops counting the number of bit error corrections and the measurement period counter 7 stops operating during the threshold detection period and during the stop-measurement period between the measurement periods.

This is because the delay T is needed from the point where I' and Q' change until the multiplex coder 4 outputs a signal which is valid for counting the number of bit error corrections in FIG. 1. The counter 7 is stopped, that is does not count, during this period.

As shown in FIG. 10, the dummy symbol inserter 2 and the phase rotator 1 are sequentially controlled so as to change the insertion position of the dummy symbol in each measurement period, while measuring the number of bit error corrections.

During the measurement period 5 shown in FIG. 10, the threshold is calculated and determined based on values 1 to 4 of the number of bit error corrections.

When value 6 of the number of bit error corrections in the measurement period 6 is lower than the threshold, this state is deemed synchronous and the synchronism signal is set to "1".

According to the invention described above, the synchronism of the viterbi decoder can be determined without separately setting the threshold from the outside.

According to the first embodiment of this invention, a viterbi decoder comprises a decoding unit which corresponds to the viterbi decoding section 3 which decodes input data; and a coding unit which corresponds to the multiplex coder 4 which codes the decoded data decoded by the decoding unit. This viterbi decoder detects the number of bit error corrections in the output of the coding unit during a measurement period which is set externally, and detects a synchronized state based on the detected number of bit error corrections and a threshold. The viterbi decoder also comprises a threshold detecting unit 8 which, when the number of synchronous states of the viterbi decoder is 1 and the number of asynchronous states is L, measures the number of bit error corrections (L+1) times during an externally set measurement period prior to the synchronizing operation of the viterbi decoder, and detects a threshold from the measured number (L+1) of bit error corrections in the output of the coding unit. Furthermore, the second number from the bottom of the (L+1) bit error corrections which were measured during the threshold detection period, that is, the smallest number of bit error corrections among the number of bit error corrections during the L number of asynchronous states, is determined as the threshold by the threshold detecting unit. Therefore, it is possible to obtain a viterbi decoder in which, by measuring the number of bit error corrections (L+1) times in a measurement period which has been externally set in a threshold detecting period, the threshold can be appropriately and easily set in accordance with the externally set measurement period.

Furthermore, this invention provides a method for controlling synchronism in a viterbi decoder comprising a decoding unit which corresponds to the viterbi decoding section 3 which decodes input data, and a coding unit which corresponds to the multiplex coder 4 which codes the decoded data decoded by the decoding unit. This viterbi decoder detects the number of bit error corrections in the output of the coding unit during a measurement period which is set externally, and detects a synchronized state based on the detected number of bit error corrections and a threshold. When the number of synchronous states of the viterbi decoder is 1 and the number of asynchronous states is L, the number of bit error corrections is measured (L+1) times during the externally set measurement period prior to the synchronizing operation of the viterbi decoder, and a threshold is detected from the measured number (L+1) of bit error corrections in the output of the coding unit.

Furthermore, the second number from the bottom of the (L+1) bit error corrections which were measured during the threshold detection period, that is, the smallest number of bit error corrections among the number of bit error corrections during the L number of asynchronous states, is used as the threshold. Therefore, it is possible to obtain a method for controlling synchronism capable of appropriately and easily setting the threshold in accordance with the externally set measurement period, by measuring the number of bit error corrections (L+1) times in the measurement period which has been externally set in a threshold detecting period.

A second embodiment of this invention will be explained with reference to FIG. 2.

Figure 2:
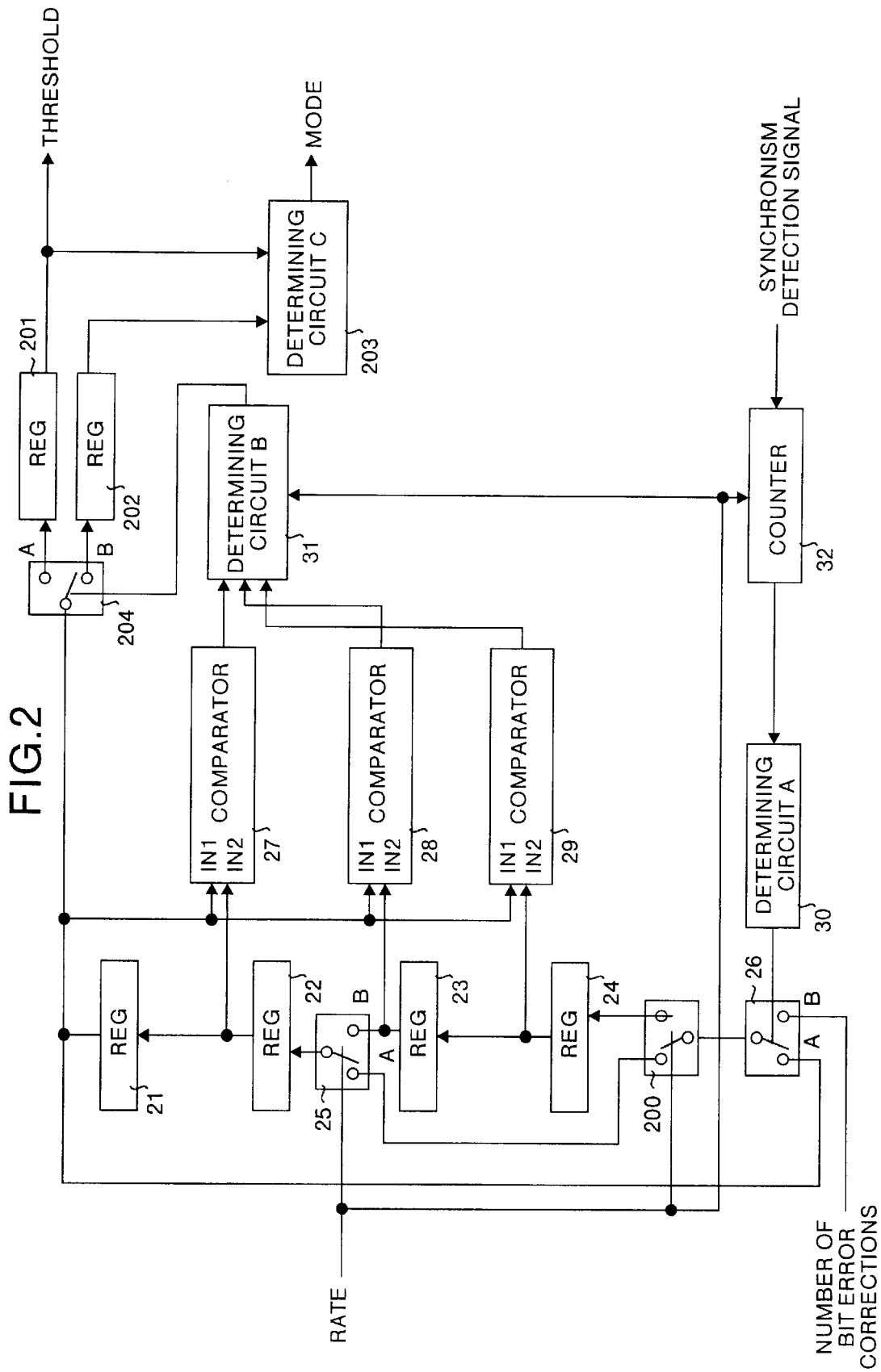
FIG. 2 is a block diagram showing the constitution of a second embodiment of this invention.

FIG. 2 shows a block diagram of a threshold detector in the second embodiment of this invention. FIG. 2 shows an example of the constitution of the threshold detector for a coding rate of 1/2 and a coding rate of 3/4.

The threshold is selected from the number of bit error corrections. In addition, it is determined whether the present operating mode is correct based on the selected threshold and the minimum number of bit error corrections.

When the coding rate is 3/4, four bit error corrections are counted. The second lowest value of the four is selected and output as the threshold.

The threshold detector comprises registers REG 21 to 24, 201 and 202, selectors 25 and 26, comparators 27 to 29, a determining circuit A:30, a determining circuit B:31, a determining circuit C:203, multiplexers 200 and 204, and a counter 32.

A RATE signal specifies whether to operate at the coding rate of 1/2 or at the coding rate of 3/4. The block diagram will be explained in the case when operating at the coding rate of 3/4.

The threshold detector can operate at three modes which depend on the value of the counter 32. When the value of the counter 32 is less than 4 then a bit error correction number capturing mode is used; when the value of the counter 32 is equal to 4 then a threshold detection mode is used; and when the value of the counter 32 is 5 or more then a threshold maintain mode is used.

In the bit error correction number capturing mode, the determining circuit A:30 controls the input of the selector 26 and selects input B, whereby the number of bit error corrections is captured in the registers REG 21 to 24.

In the registers REG 21 to 24, the operations of capturing the number of bit error corrections and shifting the registers REG 21 to 24 are performed when a synchronism detection signal is detected.

At the point where the bit error correction number capturing mode ends, the values being input to the registers REG 21 to 24 are respectively value 1, value 2, value 3 and value 4 of FIG. 11.

In the threshold detection mode, the determining circuit A:30 controls the input of the selector 26 and selects the input A.

The comparators 27 to 29 and the determining circuit B:31 start operating in the threshold detection mode.

The comparators 27 to 29 determine whether "IN>IN2", and output "1" when this is true and "0" when it is false.

Comparison is performed while shifting through the registers in the sequence register REG 21 to register REG 24, register REG 22 to register REG 21, register REG 23 to register REG 22, and register REG 24 to register REG 23.

The determining circuit B:31 counts the number of 1 which are output from the comparators 27 to 29. When the number of 1 is "1", the determining circuit B:31 selects the output A of the multiplexer 204; when the number of 1 is "0", the determining circuit B:31 selects the output B of the multiplexer 204.

When the number of 1 input into the determining circuit B:31 is "1", the value stored in the register REG 21 is the second smallest number of bit error corrections. When the number of 1 is "0", the value stored in the register REG 21 is the minimum number of bit error corrections when the number of 1 input into the determining circuit B:31 is "1", the value stored in the register REG 21 is shifted to the register REG 201 and used as the threshold in determining synchronism.

When the number of 1 input into the determining circuit B:31 is "1", the value stored in the register REG 21 is shifted to the register REG 202.

The determining circuit C:203 compares the value obtained by shifting and adding the value stored in the register REG 201 with the value stored in the register REG 202.

When the value obtained by shifting and adding the value stored in the register REG 201 is greater than the value stored in the register REG 202, it is determined that the operating mode is correct and the mode is not changed.

When the value obtained by shifting and adding the value stored in the register REG 201 is smaller than the value stored in the register REG 202, the operating mode is deemed to be incorrect and the mode signal is changed to "1" for one clock.

When the synchronism detector 6 has received the MODE signal of "1", it change the RATE signal and sets operation at the coding rate of 1/2.

When it is determined that the operating mode is correct, in the threshold maintain mode the shifts of the registers REG 21 to 24, the comparisons of the comparators 27 and 28, and the outputs of the determining circuit A:30 and the determining circuit B:31 are maintained.

When a synchronized signal is detected before eight synchronism detection signals have been counted, the counter 32 stops counting. When no synchronism signal is detected before eight synchronism detection signals have been counted, the counter 32 is initialized to "0" and restarts capturing the bit error correction signals.

In the synchronized state, the counter 32 is initialized to "0" when an asynchronism is detected.

The multiplexer 200 is controlled by the RATE signal. FIG. 2 shown a case when the coding rate is 1/2 or 3/4. If the coding rate changes, then the number of bit error corrections to be compared as well as the times the comparison is made also changes. Therefore, it is necessary to control the register that inputs the number of bit error corrections based on the coding rate. The multiplexer 200 is connected to REG 24 on the write when the RATE signal (i.e. the coding rate) is 1/2, and it is connected to selector 25 when the RATE signal is 3/4.

According to the above-described invention, the second smallest number of bit error corrections can be detected.

In the case where the coding rate is variable, it is determined whether or not the operating mode is correct by checking whether the difference between the minimum number of bit error corrections and the second smallest value is significant.

When the difference is significant, synchronism detection is carried out. When the difference is not significant, the operating mode is changed and threshold detection is carried out again.

Generally, (the value of the register REG 201/the value of the register REG 202)×100 should be less than 65 to 70 percent. The value of the register REG 201 can be determined by comparing the shifted or added value with the minimum value (The method for shifting and adding the value of the register REG 201 can be selected from several predetermined types of methods).

According to the second embodiment of this invention, a viterbi decoder comprises a decoding unit which corresponds to the viterbi decoding section 3 which decodes input data; and a coding unit which corresponds to the multiplex coder 4 which codes the decoded data decoded by the decoding unit. This viterbi decoder detects the number of bit error corrections in the output of the coding unit during a measurement period which is set externally, and detects a synchronized state based on the detected number of bit error corrections and a threshold. The viterbi decoder also comprises a threshold detecting unit 8 which, when the number of synchronous states of the viterbi decoder is 1 and the number of asynchronous states is L, measures the number of bit error corrections (L+1) times during an externally set measurement period prior to the synchronizing operation of the viterbi decoder, and detects a threshold from the measured number (L+1) of bit error corrections in the output of the coding unit. Furthermore, a threshold detection unit having a threshold selecting unit which selects the second largest number of bit error corrections from the bottom of the (L+1) number of bit error corrections; and an operating mode determining unit which determines whether an operating mode is correct based on the threshold and a minimum number of bit error corrections. Therefore, it is possible to obtain a viterbi decoder in which the threshold can be appropriately and easily set in accordance with the externally set measurement period in a suitable operating mode.

Furthermore, the second embodiment of this invention provides a method for controlling synchronism in a viterbi decoder which comprises a decoding unit which corresponds to the viterbi decoding section 3 which decodes input data, and a coding unit which corresponds to the multiplex coder 4 which codes the decoded data decoded by the decoding unit. The viterbi decoder detects the number of bit error corrections in the output of the coding unit during a measurement period which is set externally, and detects a synchronized state based on the detected number of bit error corrections and a threshold. When the number of synchronous states of the viterbi decoder is 1 and the number of asynchronous states is L, the number of bit error corrections is measured (L+1) times during an externally set measurement period prior to the synchronizing operation of the viterbi decoder, and a threshold is detected from the measured number (L+1) of bit error corrections in the output of the coding unit. Furthermore, the second largest number of bit error corrections from the bottom of the (L+1) number of bit error corrections is selected, and it is determined whether an operating mode is correct based on the threshold and a minimum number of bit error corrections. Therefore, it is possible to obtain a method for controlling synchronism in which the threshold can be appropriately and easily set in accordance with the externally set measurement period in a suitable operating mode.

A third embodiment of this invention will be explained with reference to FIG. 3.

Figure 3:
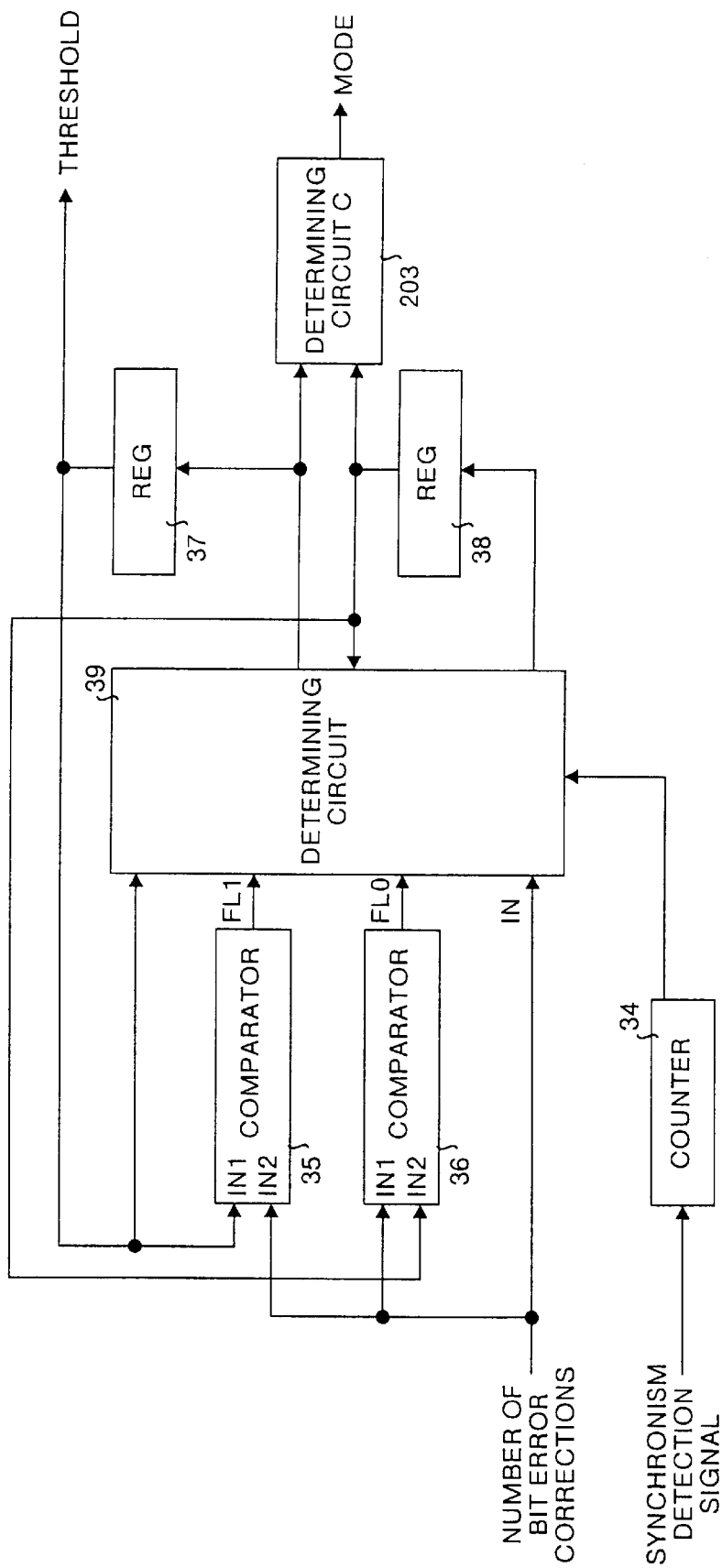
FIG. 3 is a block diagram showing the constitution of a third embodiment of this invention.

FIG. 3 shows a block diagram of a threshold detector in the third embodiment of this invention in a case where the coding rate is 3/4.

When the coding rate is 3/4, the number of bit error corrections is four, and the second number from the bottom of four is selected and output as the threshold.

The threshold detector comprises comparators 35 and 36, registers REG 37 and 38, a determining circuit 39, and a counter 34.

An operating mode determining circuit which determines whether the operating mode is correct comprises a determining circuit C:203.

This threshold detector can have two mode depending upon the counter value. When the value of the counter 34 is less than 4, the threshold detector operates in a threshold detection mode. When the value of the counter 34 is 5 or more, the threshold detector operates in a threshold maintain mode.

The operation in the threshold detecting mode will be explained below.

The comparators 35 and 36 determine whether "IN1>IN2", outputting "1" to the determining circuit 39 when the result of comparison is true and "0" when the result is false.

The determining circuit 39 performs the following operations in accordance with a combination of the comparison result FL1 of the comparator 35 and the comparison result FL0 of the comparator 36.

In this case, the initial value of the register REG 37 is all "0" and the initial value of the register REG 38 is all "1".
1. When (FL1, FL0)=(1, 1):
   Substitute the value stored in the register REG 37 with IN.
   Keep the value stored in the register REG 38 as it is.
2. When (FL1, FL0)=(1, 0):
   Substitute the value stored in the register REG 37 with the value stored in the register REG 38.
   Substitute the value stored in the register REG 38 with IN.
3. When (FL1, FL0)=(0, 1):
   Keep the value stored in the register REG 37 as it is.
   Keep the value stored in the register REG 38 as it is.
4. When (FL1, FL0)=(0, 0):
   Substitute the value stored in the register REG 37 with F.
   Substitute the value stored in the register REG 38 with IN.

In each measurement period, the comparators 35 and 36 compare the register values with the number of bit error corrections, and the values of the registers REG 37 and REG 38 are updated.

The operation in the threshold maintain mode will be explained here.

When a synchronized signal is detected before the counter 34 has counted to "8", the counter 34 stops counting. On the other hand, when no synchronized signal is detected before the counter 34 has counted to "8", the counter 34 is initialized to "0" and the operation switches again to the threshold detecting mode.

In the synchronized state, the counter 32 is initialized to "0" when asynchronism is detected, and other registers of the threshold detector are also initialized.

In the case where the coding rate is variable, the determining circuit C:203 checks whether or not the difference between the minimum number of bit error corrections and the second smallest value is significant, in order to determine whether or not the operating mode is correct.

In the circuit constitution of the second embodiment, the number of registers must correspond to the number of coding rates. In the present embodiment, various coding rates can be accommodated with few registers.

According to the third embodiment of this invention, there is provided a threshold detection unit having a threshold selection circuit which sequentially compares the number of bit error corrections in selecting the second largest number of bit error corrections from the bottom of the (L+1) number of bit error corrections; and an operating mode determining unit C:203 which determines whether the operating mode is correct based on the threshold and the minimum number of bit error corrections. Therefore, it is possible to obtain a viterbi decoder which can accommodate various coding rates with a small number of registers. Furthermore, the threshold can be appropriately and easily set in accordance with the externally set measurement period.

Furthermore, according to the third embodiment of this invention, in selecting the second largest number of bit error corrections from the bottom of the (L+1) number of bit error corrections, the number of bit error corrections is sequentially compared and a threshold is selected; it being determined whether the operating mode is correct based on the threshold and the minimum number of bit error corrections. Therefore, it is possible to obtain a method for controlling synchronism which can accommodate various coding rates with a small number of registers, and wherein the threshold can be appropriately and easily set in accordance with the externally set measurement period.

Figure 4:
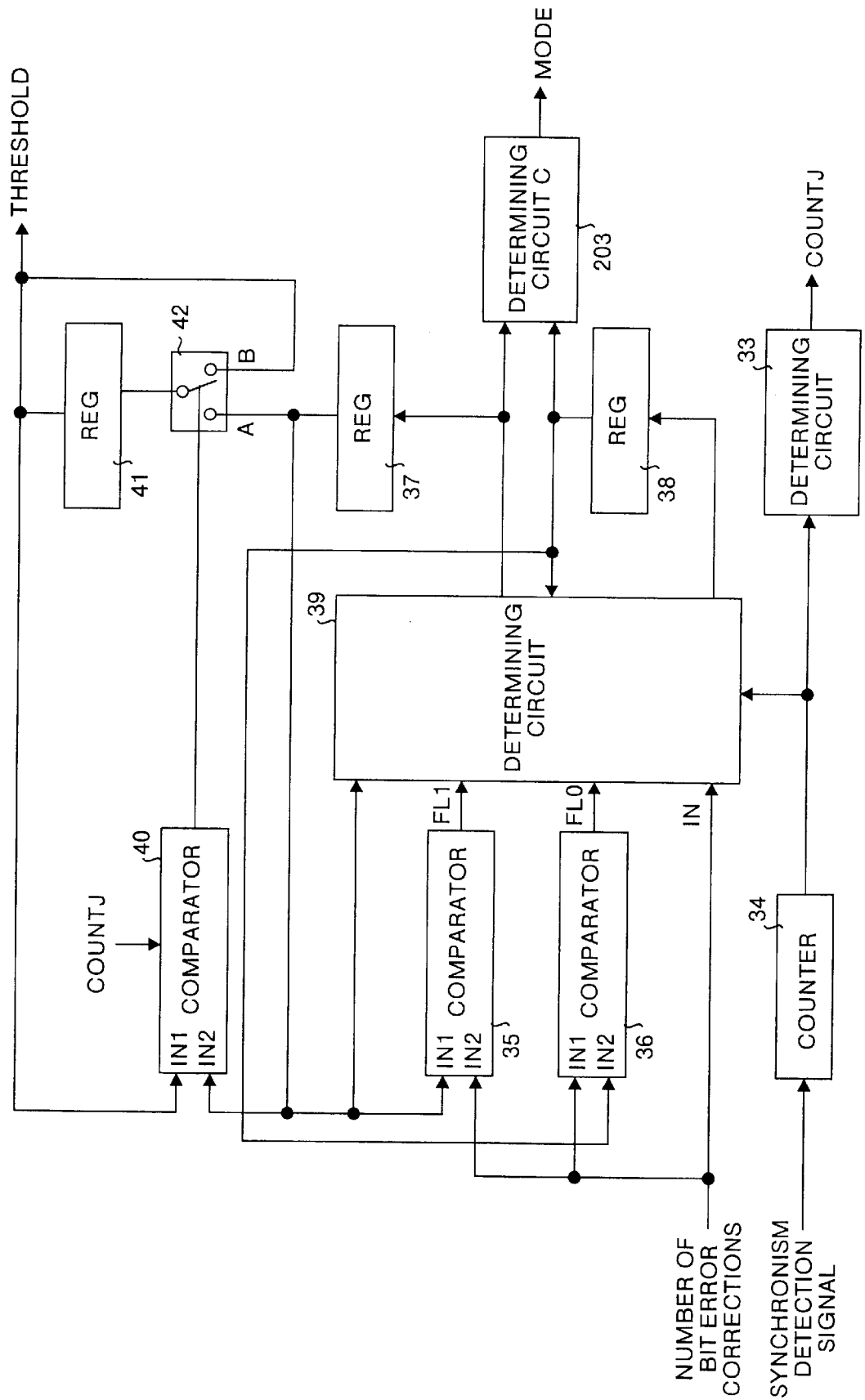
FIG. 4 is a block diagram showing the constitution of a fourth embodiment of this invention.

A fourth embodiment of this invention will be explained based on FIG. 4.

In the above-explained second and third embodiments, the threshold is determined from (L+1) bit error corrections which are measured in a single threshold detection operation.

However, in the fourth embodiment, since the number of bit error corrections varies, the threshold detection operation is repeated J times and the smallest of the J-number of detected values is used as the threshold.

The registers REG 37 and 38, the comparators 35 and 36, the determining circuit 39 and the counter 34 are same as those in FIG. 3 and have the same functions.

When the counter 34 which counts the synchronized signals has counted a value of 4, a determining circuit 33 outputs to the comparator 40 a trigger signal so as to determine whether "IN1>IN2". The comparator 40 considers "1" as a result when the result of determination is true and considers "0" as a result when the result is false, to the selector 42. The comparator 40 performs the comparison (of IN1 and IN2) only when a trigger signal is received from the determining circuit 33 and outputs "0" when it does not perform any comparison. When the result of comparison in the selector 42 is "1" it outputs the input A, and the result of comparison in the selector 42 is "0" it outputs the input B.

REG 41 comprises a register and is set to its maximum value (e.g. initial value of "all 1").

The number J specifying the number of threshold detections can be set externally to the counter 33.

When the coding rate is variable, the significant difference between the minimum number of bit error corrections and the second lowest number is determined in each threshold detecting operation. When there is little difference between the minimum number of bit error corrections and the second lowest number, the operating mode is immediately changed and threshold detection starts.

The accuracy of the threshold can be increased by performing threshold detection a multiple number of times.

According to the fourth embodiment of this invention, the threshold detection operation is repeated J times and the smallest of the J threshold candidate values is used as the threshold. Therefore, it is possible to obtain a viterbi decoder in which the precision of the threshold can be improved, and the threshold can be appropriately and easily set in accordance with the externally set measurement period.

Furthermore, according to the fourth embodiment of this invention, the threshold detecting operation is repeated J times and the smallest of the J threshold candidate values is used as the threshold. Therefore, it is possible to obtain a method for controlling synchronism which is capable of improving the precision of the threshold, and appropriately and easily setting the threshold in accordance with the externally set measurement period.

A fifth embodiment of this invention will be explained based on FIG. 5.

(L+1) bit error corrections are measured in one threshold measurement period. The viterbi decoder is synchronized when the measured number of bit error corrections is at its minimum.

Therefore, the states of the phase rotator and the dummy symbol inserter when the number of bit error corrections is at its minimum need only be stored.

The state of the phase rotator 1 is stored by storing the phase changing signal CHPH. A dummy symbol inserter 2" is provided. This comprises a RAM, registers, selectors and a counters which control them, the states of each of the counters are stored.

Figure 5:
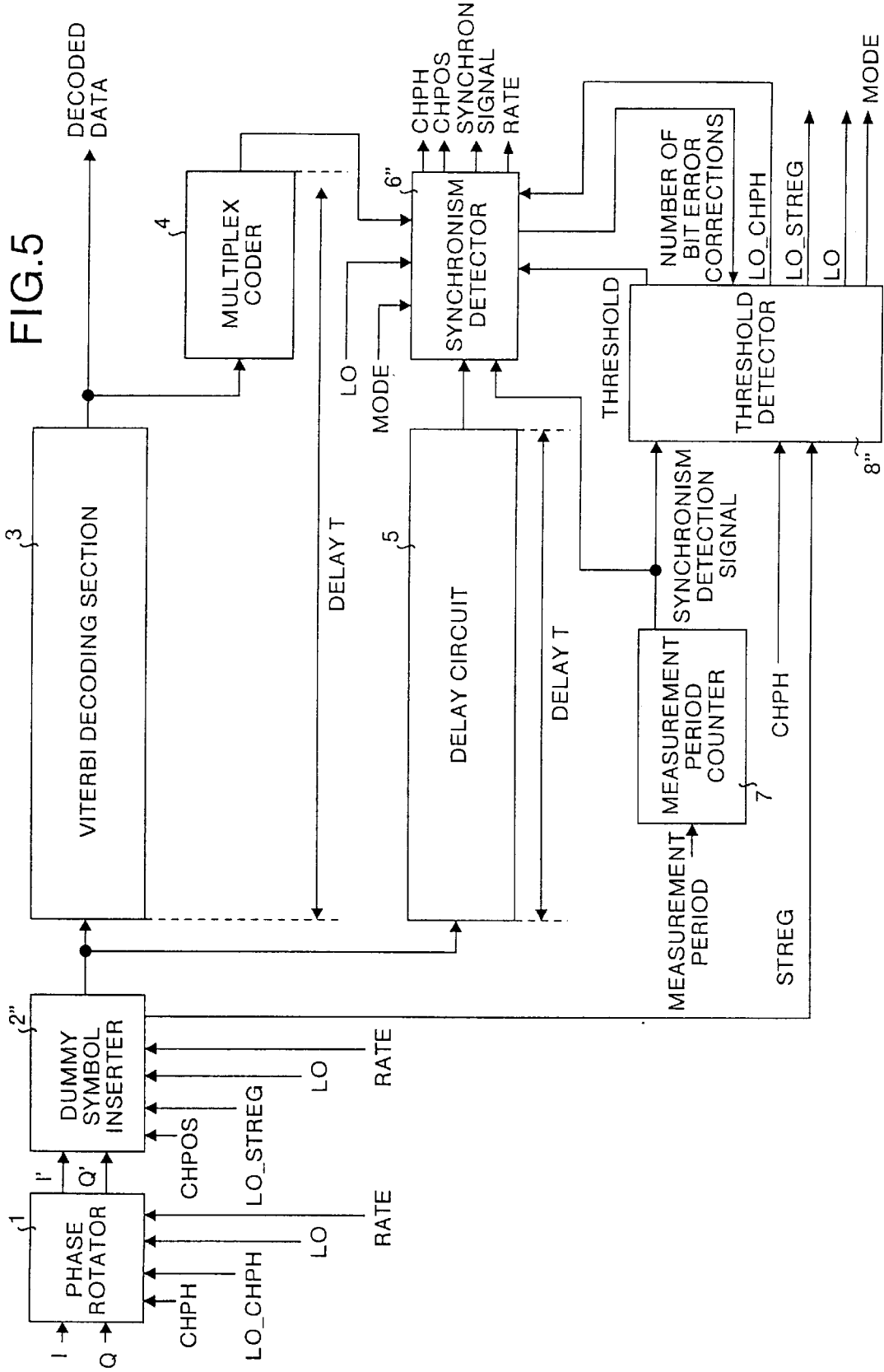
FIG. 5 is a block diagram showing the constitution of a fifth embodiment of this invention.

FIG. 5 shows a block diagram of the fifth embodiment.

The phase rotator 1, the viterbi decoding section 3, the multiplex coder 4, the delay circuit 5 and the measurement period counter 7 shown in FIG. 5 have the same designation and functions as those of FIG. 1, and will not be explained further.

The dummy symbol inserter 2" comprises the dummy symbol inserter 2 of FIG. 1 with an additional data load function. Data is loaded for all the counters in this dummy symbol inserter.

In FIG. 5, STREG represents the output of all the counters used in the dummy symbol inserter 2". LO_CHPH and LO_STREG represent the CHPH and STREG when the viterbi decoder is synchronized, LO being an update trigger.

The synchronism detector 6" shown in FIG. 5 comprises the synchronism detector 6 of FIG. 1 with an additional function of data loading. Data is loaded to the registers which output the CHPH.

The threshold detector 8" of FIG. 5 determines the threshold, and in addition stores the number (L+1) of CHPHs in one threshold measurement period and the internal state of the dummy symbol inserter 2". This threshold detector 8" identifies the CHPH and the internal state of the dummy symbol inserter 2" at synchronism.

Figure 9:
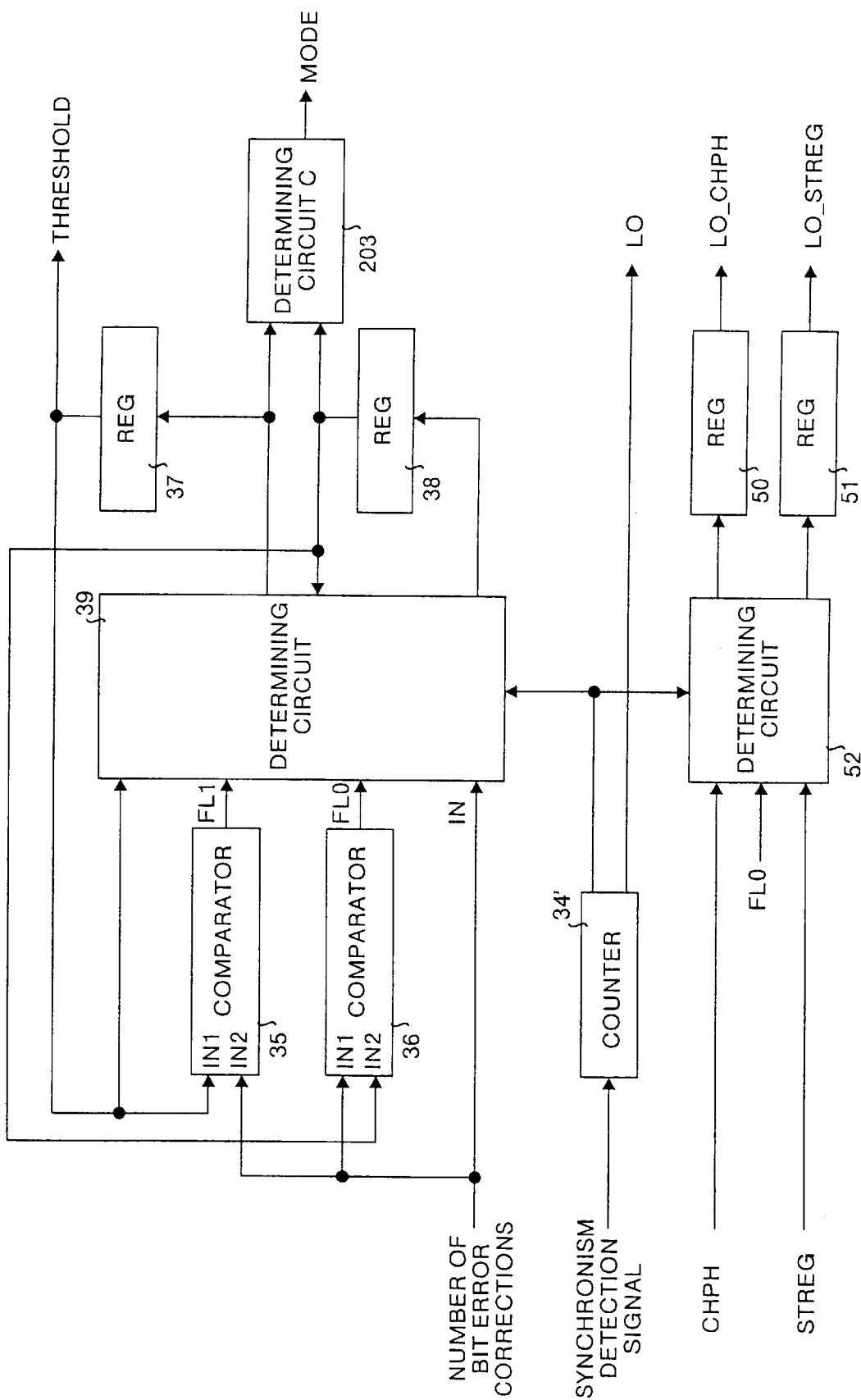
FIG. 9 is a block diagram showing the constitution of a threshold detector in the fifth embodiment of this invention.

FIG. 9 shows one example of the constitution of the threshold detector 8" shown in FIG. 5.

The registers 37 and 38, the comparators 35 and 36 and the determining circuit 39 have the same functions as those in FIG. 3.

The counter 34' outputs the update trigger LO one clock after the counted value has reached (L+1).

A synchronism detection signal is input to a determining circuit 52 and when FL0 is 1, the determining circuit 52 substitutes the CHPH to the register REG 50, and STREG to the register REG 51.

According to this invention, it is possible to shift from the threshold detection mode to a synchronized state, thereby eliminating the time needed to detect synchronism.

According to the fifth embodiment of this invention, viterbi decoder comprises a phase rotating unit which corresponds to the phase rotator 1 which rotates the phase of input data; a dummy symbol inserting unit which corresponds to the dummy symbol inserter 2" which inserts a dummy symbol into the output of the phase rotating unit; a decoding unit which corresponds to the viterbi decoding section 3 which decodes input data, the phase of the input having been rotated by the phase rotating unit and a dummy symbol having been inserted to the input data by the dummy symbol inserting unit; and a coding unit which corresponds to the multiplex coder 4 which codes decoded data which has been decoded by the decoding unit. The viterbi decoder detects the number of bit error corrections in the output of the coding unit during a measurement period which is set externally, and detects a synchronized state based on the detected number of bit error corrections and a threshold. The viterbi decoder has a state storing unit which corresponds to the register REG 50 and the register REG 51 for storing a state of the dummy symbol inserting unit, it being possible to shift immediately to a synchronized state when the state storing unit transmits data to the dummy symbol inserting unit after a threshold detection period. Therefore, the viterbi decoder can be obtained in which it is possible to shift speedily from the threshold detection mode to a synchronized state, and the threshold can be appropriately and easily set in accordance with the externally set measurement period.

Furthermore, the fifth embodiment of this invention provides a method for controlling synchronism in a viterbi decoder which comprises a phase rotating unit which corresponds to the phase rotator 1 which rotates the phase of input data; a dummy symbol inserting unit which corresponds to the dummy symbol inserter 2" which inserts a dummy symbol into the output of the phase rotating unit; a viterbi decoding unit which corresponds to the viterbi decoding section 3 which decodes input data, the phase of the input having been rotated by the phase rotating unit and a dummy symbol having been inserted to the input data by the dummy symbol inserting unit; and a coding unit which corresponds to the multiplex coder 4 which codes decoded data which has been decoded by the decoding unit. The viterbi decoder detects the number of bit error corrections in the output of the coding unit during a measurement period which is set externally, and detects a synchronized state based on the detected number of bit error corrections and a threshold. The method further comprises steps of storing a state of the dummy symbol inserting unit, and making it possible to shift immediately to a synchronized state when the state storing unit transmits data to the dummy symbol inserting unit after a threshold detecting period. Therefore, a method for controlling synchronism can be obtained in which it is possible to shift speedily from the threshold detecting mode to a synchronized state, and the threshold can be appropriately and easily set in accordance with the externally set measurement period.

A sixth embodiment of this invention will be explained based on FIG. 6.

Figure 6:
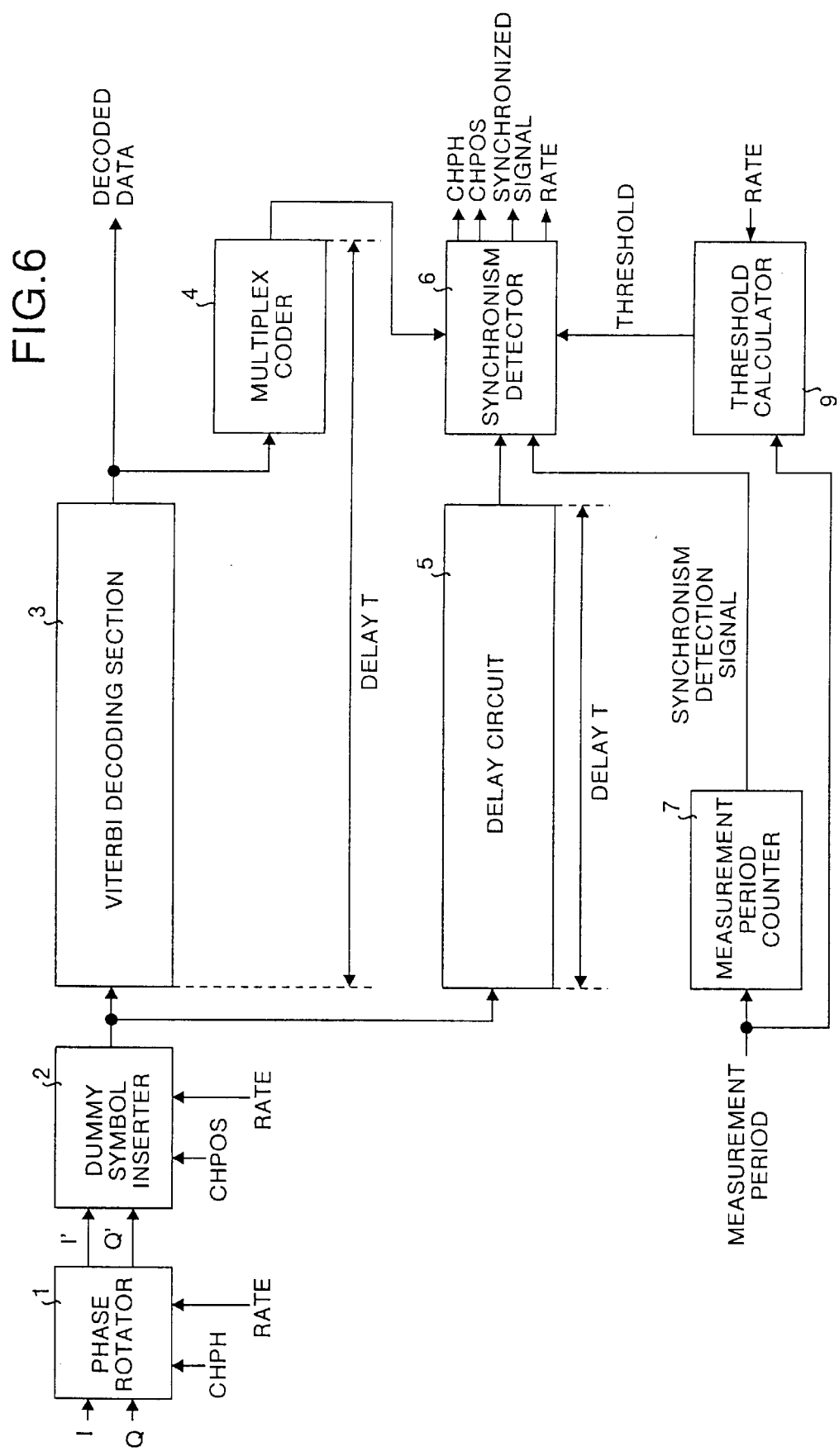
FIG. 6 is a block diagram showing the constitution of a sixth embodiment of this invention.

The phase rotator 1, the dummy symbol inserter 2, the viterbi decoding section 3, the multiplex coder 4, the delay circuit 5, the synchronism detector 6 and the measurement period counter 7 shown in FIG. 6 perform same or similar functions to those shown in FIG. 1. Therefore, their explanation will be omitted.

A newly provided threshold calculator 9 calculates the threshold from the value of the externally set measurement period. The threshold calculator 9 comprises register(s) and adder(s).

For example, to set 75 percent of the measurement period as the threshold, the value obtained by shifting the value of the measurement period two bits to the right (one-quarter of the set value) is added to the value obtained by shifting the value of the measurement period one bit to the right (one-half of the set value), or the value obtained by a shift of two bits to the right from the set value is subtracted therefrom.

The threshold can be set merely by adding a shift and an adder to the conventional viterbi decoder without providing a plurality of threshold detecting periods as in the fourth embodiment, thereby simplifying the circuit constitution.

According to the sixth embodiment of this invention, a viterbi decoder comprises a decoding unit which corresponds to the viterbi decoding section 3 which decodes input data; and a coding unit which codes the data decoded by the decoding unit. The viterbi decoder detects the number of bit error corrections in the output of the coding unit during a measurement period which is set externally, and detects the synchronized state based on the detected number of bit error corrections and a threshold. The viterbi decoder further comprises a threshold calculating unit 9 which comprises register(s) and adder(s) for calculating a threshold from the value of the measurement period set externally. Therefore, it is possible to obtain the viterbi decoder wherein the threshold can be appropriately and easily set in accordance with the externally set measurement period by means of a simple constitution.

Furthermore, the sixth embodiment of this invention provides a method for controlling synchronism in a viterbi decoder which comprises a decoding unit which corresponds to the viterbi decoding section 3 which decodes input data, and a coding unit which codes the data decoded by the decoding unit. The viterbi decoder detects the number of bit error corrections in the output of the coding unit during a measurement period which is set externally, and detects a synchronized state based on the detected number of bit error corrections and a threshold. The method further comprises the steps of calculating a threshold from the value of the measurement period set externally. Therefore, it is possible to obtain the method for controlling synchronism wherein the threshold can be appropriately and easily set in accordance with the externally set measurement period by means of a simple constitution.

A seventh embodiment of this invention will be explained based on FIG. 7.

Figure 7:
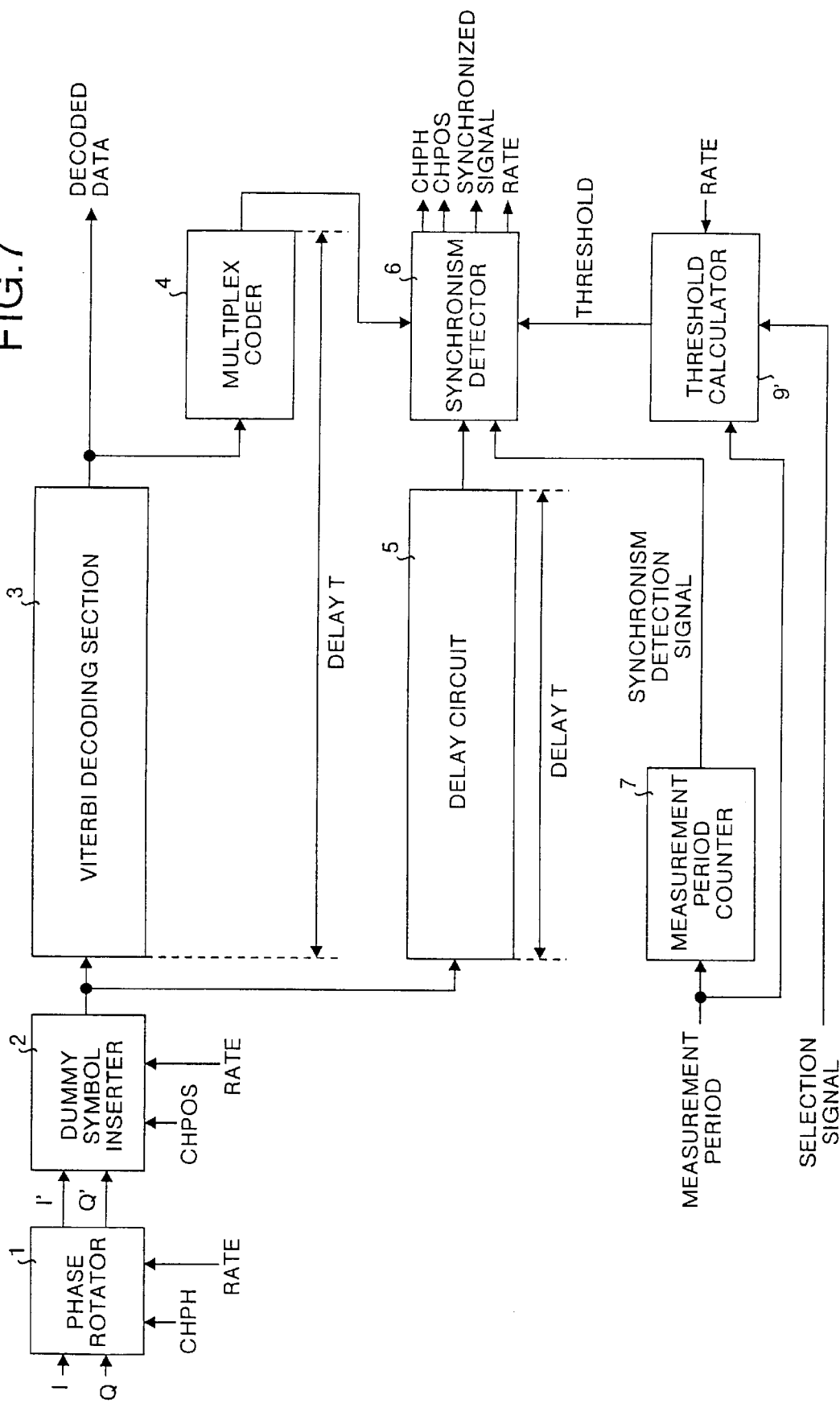
FIG. 7 is a block diagram showing the constitution of a seventh embodiment of this invention.

The phase rotator 1, the dummy symbol inserter 2, the viterbi decoding section 3, the multiplex coder 4, the delay circuit 5, the synchronism detector 6 and the measurement period counter 7 shown in FIG. 7 perform same or similar functions to those shown in FIG. 1. Therefore, their explanation will be omitted.

A newly provided threshold calculator 9' calculates a threshold based on the value of the externally set measurement period and a scaling signal. The threshold calculator 9' can be configured by using register(s) and adder(s).

For example, to set 75 percent, 62.5 percent, 59 percent, 56 percent and 50 percent of the measurement period as the thresholds, the following values are provided: a value obtained by shifting the value of the measurement period one bit to the right (one-half of the set value), a value obtained by shifting the value of the measurement period two bits to the right (one-quarter of the set value), a value obtained by a shifting the value of the measurement period three bits to the right (one-eighth of the set value), a value obtained by a shifting the value of the measurement period four bits to the right (one-sixteenth of the set value), and a value obtained by a shifting the value of the measurement period five bits to the right (one-thirty-second of the set value).

Setting can be realized by adding using a selecting signal, or by subtracting a value obtained by a shift of two bits to the right of the set value.

The circuit constitution is simple and multiple thresholds can be selected.

According to the seventh embodiment of this invention, viterbi decoder comprises a decoding unit which corresponds to the viterbi decoding section 3 which decodes input data; and a coding unit which corresponds to the multiplex coder 4 which codes the data decoded by the decoding unit. This viterbi decoder detects the number of bit error corrections in the output of the coding unit during a measurement period which is set externally, and detects the synchronized state based on the detected number of bit error corrections and a threshold. The viterbi decoder further comprises a scaling unit which corresponds to the threshold calculator 9' which determines the threshold by setting a ratio between the measurement period and the threshold, and a plurality of scaling values obtained from the scaling unit are used as the thresholds. Therefore, it is possible to obtain the viterbi decoder wherein a plurality of thresholds can be selected, and the threshold can be appropriately and easily set in accordance with the externally set measurement period by means of a simple constitution.

Furthermore, the seventh embodiment of this invention provides a method for controlling synchronism in a viterbi decoder which comprises a decoding unit which corresponds to the viterbi decoding section 3 which decodes input data, and a coding unit which corresponds to the multiplex coder 4 which codes the data decoded by the decoding unit. This viterbi decoder detects the number of bit error corrections in the output of the coding unit during a measurement period which is set externally, and detects the synchronized state based on the detected number of bit error corrections and a threshold. The threshold is determined by setting a ratio between the measurement period and the threshold as the scaling value. A plurality of scaling values are used as the threshold. Therefore, it is possible to obtain the method for controlling synchronism wherein a plurality of thresholds can be selected using a simple operating mode, and the threshold can be appropriately and easily set in accordance with the externally set measurement period by means of a simple constitution.

An eighth embodiment of this invention will be explained based on FIG. 8.

Figure 8:
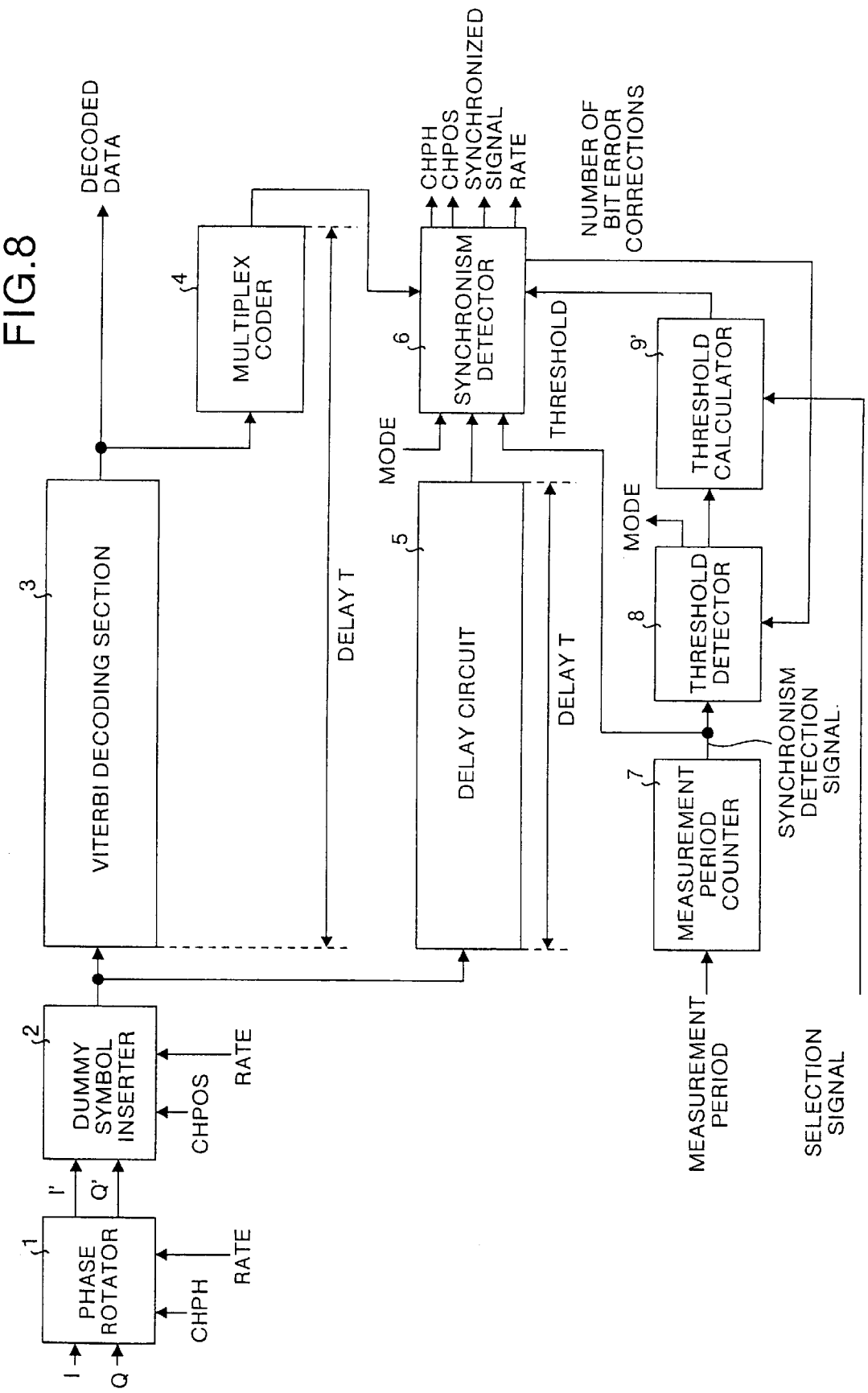
FIG. 8 is a block diagram showing the constitution of an eighth embodiment of this invention.

The phase rotator 1, the dummy symbol inserter 2, the viterbi decoding section 3, the multiplex coder 4, the delay circuit 5, the synchronism detector 6 and the measurement period counter 7 shown in FIG. 8 perform same or similar functions to those shown in FIG. 1. Therefore, their explanation will be omitted. Furthermore, the threshold detector 8 performs the same function as that shown in FIG. 5, and will not be explained.

The threshold calculator 9' shown in FIG. 8 performs same function as that shown in FIG. 7, and will not be explained further.

In the eighth embodiment, the output of the threshold detector 8 is scaled further by the threshold calculator 9' and used as the threshold.

This constitution enables the threshold to be set in accordance with the state of the transmission path.

According to the eighth embodiment of this invention, the output of a threshold detection is scaled and used as a threshold. Therefore, it is possible to obtain a viterbi decoder wherein the threshold can be set in accordance with the condition of the transmission path, and the threshold can be easily and appropriately set in accordance with the externally set measurement period.

Furthermore, the output of a threshold detector is processed by a scaling value and used as a threshold. Therefore, it is possible to obtain a method for controlling synchronism wherein the threshold can be set in accordance with the condition of the transmission path, and the threshold can be easily and appropriately set in accordance with the externally set measurement period.

According to the viterbi decoder of one aspect of the present invention, the viterbi decoder comprises a decoding unit which corresponds to the viterbi decoding section which decodes input data, and a coding unit which codes the decoded data decoded by the decoding unit. This viterbi decoder detects the number of bit error corrections in the output of the coding unit during a measurement period which is set externally, and detects a synchronized state based on the detected number of bit error corrections and a threshold. The viterbi decoder further comprises a threshold detection unit which detects a threshold from the detected number of bit error corrections in the output of the coding unit during a threshold detection period including the externally set measurement period. Therefore, it is possible to obtain a viterbi decoder wherein the threshold can be easily and appropriately set in accordance with the externally set measurement period.

According to the viterbi decoder of another aspect of the present invention, the viterbi decoder comprises a decoding unit which corresponds to the viterbi decoding section which decodes input data; and a coding unit which codes the decoded data decoded by the decoding unit. This viterbi decoder detects the number of bit error corrections in the output of the coding unit during a measurement period which is set externally, and detects a synchronized state based on the detected number of bit error corrections and a threshold. The viterbi decoder further comprises a threshold detection unit which, when the number of synchronous states of the viterbi decoder is 1 and the number of asynchronous states is L, measures the number of bit error corrections (L+1) times during an externally set measurement period prior to the synchronizing operation of the viterbi decoder, and detects a threshold from the measured number (L+1) of bit error corrections in the output of the coding unit. Therefore, it is possible to obtain a viterbi decoder wherein, by detecting the threshold based on the number of bit error corrections of the measured (L+1), the threshold can be easily and appropriately set in accordance with the externally set measurement period.

Further, the second number from the bottom of the (L+1) bit error corrections which were measured during the threshold measurement period, that is, the smallest number of bit error corrections among the number of bit error corrections during the L number of asynchronous states, is determined as the threshold by the threshold detection unit. Therefore, it is possible to obtain a viterbi decoder wherein the threshold can be easily and appropriately set in accordance with the externally set measurement period.

Further, the viterbi decoder comprises a threshold detection unit having a threshold selection unit which selects the second largest number of bit error corrections from the bottom of the (L+1) number of bit error corrections; and an operating mode determining unit which determines whether an operating mode is correct based on the threshold and a minimum number of bit error corrections. Therefore, it is possible to obtain a viterbi decoder wherein the threshold can be easily and appropriately set in accordance with the externally set measurement period in a suitable operation mode.

Further, the viterbi decoder comprises a threshold detection unit having a threshold selection unit which sequentially compares the number of bit error corrections in selecting the second largest number of bit error corrections from the bottom of the (L+1) number of bit error corrections; and an operating mode determining unit which determines whether the operating mode is correct based on the threshold and the minimum number of bit error corrections. Therefore, it is possible to obtain a viterbi decoder wherein a variety of coding rates can be accommodated using few registers, and the threshold can be easily and appropriately set in accordance with the externally set measurement period.

Further, a threshold detecting operation is repeated J (where J is an integer) times and the smallest of the J threshold candidate values is used as the threshold. Therefore, it is possible to obtain a viterbi decoder wherein the precision of the threshold can be increased, and in addition, the threshold can be easily and appropriately set in accordance with the externally set measurement period.

According to the viterbi decoder of still another aspect of the present invention, the viterbi decoder comprises a phase rotating unit which rotates the phase of input data; a dummy symbol inserting unit which inserts a dummy symbol into the output of the phase rotating unit; a viterbi decoding unit which corresponds to the viterbi decoding section which decodes input data, the phase of the input having been rotated by the phase rotating unit and a dummy symbol having been inserted into the input data by the dummy symbol inserting unit; and a coding unit which codes decoded data which has been decoded by the decoding unit. This viterbi decoder detects the number of bit error corrections in the output of the coding unit during a measurement period which is set externally, and detects a synchronized state based on the detected number of bit error corrections and a threshold. The viterbi decoder further comprises a state storing unit for storing a state of the dummy symbol inserting unit, it being possible to shift immediately to a synchronized state when the state storing unit transmits data to the dummy symbol inserting unit after a threshold detection period. Therefore, it is possible to obtain a viterbi decoder which can shift speedily from the threshold detecting mode to a state of synchronism, and wherein the threshold can be easily and appropriately set in accordance with the externally set measurement period.

According to the viterbi decoder of still another aspect of the present invention, the viterbi decoder comprises a decoding unit which corresponds to the viterbi decoding section which decodes input data; and a coding unit which codes the data decoded by the decoding unit. This viterbi decoder detects the number of bit error corrections in the output of the coding unit during a measurement period which is set externally, and detecting a synchronized state based on the detected number of bit error corrections and a threshold. The viterbi decoder further comprises a threshold calculating unit which comprises register(s) and adder(s) for calculating a threshold from a measurement period and a value set externally. Therefore, it is possible to obtain a viterbi decoder having a simple constitution, wherein the threshold can be easily and appropriately set in accordance with the externally set measurement period.

According to the viterbi decoder of still another aspect of the present invention, the viterbi decoder comprises a decoding unit which corresponds to the viterbi decoding section which decodes input data; and a coding unit which codes the data decoded by the decoding unit. This viterbi decoder detects the number of bit error corrections in the output of the coding unit during a measurement period which is set externally, and detects a synchronized state based on the detected number of bit error corrections and a threshold. The viterbi decoder further comprises a scaling unit which determines the threshold by setting a ratio between the measurement period and the threshold. Therefore, it is possible to obtain a viterbi decoder having a simple constitution, wherein the threshold can be selected and easily and appropriately set in accordance with the externally set measurement period.

Further, a plurality of scaling values are used as the thresholds. Therefore, it is possible to obtain a viterbi decoder having a simple constitution wherein a plurality of thresholds can be selected, and the thresholds can be easily and appropriately set in accordance with the externally set measurement period.

Further, the output of the threshold detector is scaled and used as the threshold. Therefore, it is possible to obtain a viterbi decoder wherein the threshold can be set in accordance with the condition of the transmission path, and in addition, the threshold can be easily and appropriately set in accordance with the externally set measurement period.

According to the method for controlling synchronism of still another aspect of the present invention, the viterbi decoder which comprises a decoding unit corresponding to the viterbi decoding section which decodes input data, and a coding unit which codes the decoded data decoded by the decoding unit. This viterbi decoder detects a number of bit error corrections in the output of the coding unit during a measurement period which is set externally, and detects a synchronized state based on the detected number of bit error corrections and a threshold. The method further comprises the steps of detecting a number of bit error corrections in the output of the coding unit during a threshold detection period including the externally set measurement period for a predetermined number of times, and detecting a threshold from the detected number of bit error corrections. Therefore, it is possible to obtain a method for controlling synchronism wherein the threshold can be easily and appropriately set in accordance with the externally set measurement period.

According to the method for controlling synchronism of still another aspect of the present invention, the viterbi decoder which comprises a decoding unit corresponding to the viterbi decoding section which decodes input data, and a coding unit which codes the decoded data decoded by the decoding unit. This viterbi decoder detects the number of bit error corrections in the output of the coding unit during a measurement period which is set externally, and detects a synchronized state based on the detected number of bit error corrections and a threshold. When the number of synchronous states of the viterbi decoder is 1 and the number of asynchronous states is L, the number of bit error corrections is measured (L+1) times during an externally set measurement period prior to the synchronizing operation of the viterbi decoder, and a threshold is detected from the measured number (L+1) of bit error corrections in the output of the coding unit. Therefore, it is possible to obtain a method for controlling synchronism wherein, by detecting the threshold based on the number of bit error corrections of the measured (L+1), the threshold can be easily and appropriately set in accordance with the externally set measurement period.

Further, the second number from the bottom of the (L+1) bit error corrections which were measured during the threshold measurement period, that is, the smallest number of bit error corrections among the number of bit error corrections during the L number of asynchronous states, is used as the threshold. Therefore, it is possible to obtain a method for controlling synchronism wherein the threshold can be easily and appropriately set in accordance with the externally set measurement period.

Further, the second largest number of bit error corrections from the bottom of the (L+1) number of bit error corrections is selected, and it is determined whether an operating mode is correct based on the threshold and a minimum number of bit error corrections. Therefore, it is possible to obtain a method for controlling synchronism wherein the threshold can be easily and appropriately set in accordance with the externally set measurement period in a suitable operating mode.

Further, in selecting the second largest number of bit error corrections from the bottom of the (L+1) number of bit error corrections, the number of bit error corrections is sequentially compared and a threshold is selected; it being determined whether the operating mode is correct based on the threshold and the minimum number of bit error corrections. Therefore, it is possible to obtain a method for controlling synchronism wherein the threshold can be easily and appropriately set in accordance with the externally set measurement period in a suitable operating mode and with a reliably selected threshold.

Further, the threshold detection operation is repeated J times (where J is an integer) and the smallest of the J threshold candidate values is used as the threshold. Therefore, it is possible to obtain a method for controlling synchronism wherein the precision of the threshold can be increased, and in addition, the threshold can be easily and appropriately set in accordance with the externally set measurement period.

According to the method for controlling synchronism of still another aspect of the present invention, the viterbi decoder which comprises a phase rotating unit which rotates the phase of input data; a dummy symbol inserting unit which inserts a dummy symbol into the output of the phase rotating unit; a viterbi decoding unit corresponding to the viterbi decoding section which decodes input data, the phase of the input having been rotated by the phase rotating unit and a dummy symbol having been inserted to the input data by the dummy symbol inserting unit; and a coding unit which codes decoded data which has been decoded by the decoding unit. This viterbi decoder detects the number of bit error corrections in the output of the coding unit during a measurement period which is set externally, and detects a synchronized state based on the detected number of bit error corrections and a threshold. The method further comprises the steps of storing a state of the dummy symbol inserting unit, and making it possible to shift immediately to a synchronized state when the state storing unit transmits data to the dummy symbol inserting unit after a threshold detecting period. Therefore, it is possible to obtain a method for controlling synchronism which can speedily shift the viterbi decoder from the threshold detecting mode to a state of synchronism, and can easily and appropriately set the threshold in accordance with the externally set measurement period.

According to the method for controlling synchronism of still another aspect of the present invention, the viterbi decoder which comprises a decoding unit corresponding to the viterbi decoding section which decodes input data, and a coding unit which codes the data decoded by the decoding unit. This viterbi decoder detects the number of bit error corrections in the output of the coding unit during a measurement period which is set externally, and detects a synchronized state based on the detected number of bit error corrections and a threshold. The method further comprises the steps of calculating a threshold from a measurement period and a value which are set externally. Therefore, it is possible to obtain a method for controlling synchronism wherein the threshold can be easily and appropriately set in accordance with the externally set measurement period in a simple operating mode.

According to the method for controlling synchronism of still another aspect of the present invention, the viterbi decoder which comprises a decoding unit corresponding to the viterbi decoding section which decodes input data, and a coding unit which codes the data decoded by the decoding unit. This viterbi decoder detects the number of bit error corrections in the output of the coding unit during a measurement period which is set externally, and detects a synchronized state based on the detected number of bit error corrections and a threshold. The threshold is determined by setting a ratio between the measurement period and the threshold as the scaling value. Therefore, it is possible to obtain a method for controlling synchronism wherein the threshold can be selected by means of a simple constitution, and in addition, the threshold can be easily and appropriately set in accordance with the externally set measurement period.

Further, a plurality of scaling values are used as the thresholds. Therefore, it is possible to obtain a method for controlling synchronism wherein the threshold can be selected by using a simple constitution, and in addition, the threshold can be easily and appropriately set in accordance with the externally set measurement period.

Further, a threshold detection output is processed by a scaling value and used as a threshold. Therefore, it is possible to obtain a method for controlling synchronism wherein the threshold can be set in accordance with the condition of the transmission path, and in addition, the threshold can be easily and appropriately set in accordance with the externally set measurement period.

Note 1: A viterbi decoder comprising:
- a decoding unit which decodes input data;
- a coding unit which codes the data decoded by said decoding unit;
- a bit error corrections detecting unit which detects the number of bit error corrections in the output of said coding unit during a measurement period set externally;
- a synchronized state detecting unit which detects a synchronized state based on the number of bit error corrections detected by said bit error corrections detecting unit and a threshold; and
- a threshold detecting unit which detects the threshold based on the number of bit error corrections detected by said bit error corrections detecting unit during a pre-set threshold detection period that includes the measurement period.

Note 2: The viterbi decoder according to note 1, wherein the operation of detection of the threshold is repeated J times (where J is an integer) and the smallest of the J threshold candidate values is used as the threshold.

Note 3: A viterbi decoder comprising:
- a decoding unit which decodes input data;
- a coding unit which codes the data decoded by said decoding unit;
- a bit error corrections detecting unit which detects the number of bit error corrections in the output of said coding unit during a measurement period set externally;
- a synchronized state detecting unit which detects a synchronized state based on the number of bit error corrections detected by said bit error corrections detecting unit and a threshold; and
- a threshold detecting unit which, when the number of synchronous states of said viterbi decoder is 1 and the number of asynchronous states is L, measures the number of bit error corrections (L+1) times during the measurement period prior to the synchronizing operation of said viterbi decoder, and detects the threshold based on the measured number (L+1) of bit error corrections detected by said bit error corrections detecting unit.

Note 4: The viterbi decoder according to note 3, wherein the second number from the bottom of the (L+1) bit error corrections which were measured during the threshold measurement period, that is, the smallest number of bit error corrections among the number of bit error corrections during the L number of asynchronous states, is determined as the threshold by said threshold detecting unit.

Note 5: The viterbi decoder according to note 4 further comprising a threshold detecting unit having,
- a threshold selecting unit which selects the second largest number of bit error corrections from the bottom of the (L+1) number of bit error corrections; and
- an operating mode determining unit which determines whether an operating mode is correct based on the threshold and a minimum number of bit error corrections.

Note 6: The viterbi decoder according to note 4 further comprising a threshold detecting unit having,
- a threshold selecting circuit which sequentially compares the number of bit error corrections in selecting the second largest number of bit error corrections from the bottom of the (L+1) number of bit error corrections; and
- an operating mode determining unit which determines whether the operating mode is correct based on the threshold and the minimum number of bit error corrections.

Note 7: The viterbi decoder according to note 3, wherein the operation of detection of the threshold is repeated J times (where J is an integer) and the smallest of the J threshold candidate values is used as the threshold.

Note 8: The viterbi decoder according to note 3, wherein the output of a threshold detecting unit is scaled and used as a threshold.

Note 9: A viterbi decoder comprising:
- a phase rotating unit which rotates the phase of input data;
- a dummy symbol inserting unit which inserts a dummy symbol into the output of said phase rotating unit;
- a viterbi decoding unit which decodes the output of said dummy symbol inserting unit;
- a coding unit which codes the data decoded by said decoding unit;
- a bit error corrections detecting unit which detects the number of bit error corrections in the output of said coding unit during a measurement period set externally;
- a synchronized state detecting unit which detects a synchronized state based on the number of bit error corrections detected by said bit error corrections detecting unit and a threshold;
- a state storing unit for storing a state of said dummy symbol inserting unit,
- wherein it being possible to shift immediately to a synchronized state when said state storing unit transmits data to said dummy symbol inserting unit after a threshold detection period.

Note 10: A viterbi decoder comprising:
- a decoding unit which decodes input data;
- a coding unit which codes the data decoded by said decoding unit;
- a bit error corrections detecting unit which detects the number of bit error corrections in the output of said coding unit during a measurement period set externally;
- a synchronized state detecting unit which detects a synchronized state based on the number of bit error corrections detected by said bit error corrections detecting unit and a threshold; and
- a threshold calculating unit having register(s) and adder(s) for calculating the threshold based on the value of the measurement period.

Note 11: A viterbi decoder comprising:
- a decoding unit which decodes input data;
- a coding unit which codes the data decoded by said decoding unit;
- a bit error corrections detecting unit which detects the number of bit error corrections in the output of said coding unit during a measurement period set externally;
- a synchronized state detecting unit which detects a synchronized state based on the number of bit error corrections detected by said bit error corrections detecting unit and a threshold; and
- a scaling unit which determines the threshold by setting a ratio between the measurement period and the threshold.

Note 12: The viterbi decoder according to note 11, wherein a plurality of scaling values are used as the thresholds.

Note 13: A method for controlling synchronism in a viterbi decoder, said viterbi decoder comprising a decoding unit which decodes input data, and a coding unit which codes the data decoded by said decoding unit, said method comprising the steps of:
- detecting the number of bit error corrections in the output of said coding unit during a measurement period set externally;
- detecting a synchronized state based on the detected number of bit error corrections a threshold; and
- detecting the number of bit error corrections in the output of said coding unit during a pre-set threshold detection period that includes the measurement period, and then detecting the threshold based on these detected number of bit error corrections.

Note 14: The method for controlling synchronism according to note 13, wherein a threshold detecting operation is repeated J times (where J is an integer) and the smallest of the J threshold candidate values is used as the threshold.

Note 15: A method for controlling synchronism in a viterbi decoder, said viterbi decoder comprising a decoding unit which decodes input data, and a coding unit which codes the data decoded by said decoding unit, said method comprising the steps of:
- detecting the number of bit error corrections in the output of said coding unit during a measurement period set externally;
- detecting a synchronized state based on the detected number of bit error corrections a threshold; wherein, when the number of synchronous states of said viterbi decoder is 1 and the number of asynchronous states is L, the number of bit error corrections is measured (L+1) times during the measurement period prior to the synchronizing operation of said viterbi decoder; and
- detecting the threshold based on the measured number (L+1) of bit error corrections.

Note 16: The method for controlling synchronism according to note 15, wherein the second number from the bottom of the (L+1) bit error corrections which were measured during the threshold measurement period, that is, the smallest number of bit error corrections among the number of bit error corrections during the L number of asynchronous states, is used as the threshold.

Note 17: The method for controlling synchronism according to note 16, wherein the second largest number of bit error corrections from the bottom of the (L+1) number of bit error corrections is selected, and it is determined whether an operating mode is correct based on the threshold and a minimum number of bit error corrections.

Note 18: The method for controlling synchronism according to note 16, wherein, in selecting the second largest number of bit error corrections from the bottom of the (L+1) number of bit error corrections, the number of bit error corrections is sequentially compared and a threshold is selected; it being determined whether the operating mode is correct based on the threshold and the minimum number of bit error corrections.

Note 19: The method for controlling synchronism according to note 15, wherein a threshold detecting operation is repeated J times (where J is an integer) and the smallest of the J threshold candidate values is used as the threshold.

Note 20: The method for controlling synchronism according to note 15, wherein a threshold detection output is processed by a scaling value and used as a threshold.

Note 21: A method for controlling synchronism in a viterbi decoder, said viterbi decoder comprising a phase rotating unit which rotates the phase of input data, a dummy symbol inserting unit which inserts a dummy symbol into the output of said phase rotating unit, a viterbi decoding unit which decodes the output of said dummy symbol inserting unit, and a coding unit which codes the data decoded by said decoding unit; said method comprising the steps of:

detecting the number of bit error corrections in the output of said coding unit during a measurement period set externally;
  detecting a synchronized state based on the number of bit error corrections detected by said bit error corrections detecting unit and a threshold;
  storing a state of said dummy symbol inserting unit; and
  making it possible to shift immediately to a synchronized state by transmitting the stored data regarding the state to said dummy symbol inserting unit after a threshold detection period.

Note 22: A method for controlling synchronism in a viterbi decoder, said viterbi decoder comprising a decoding unit which decodes input data, a coding unit which codes the data decoded by said decoding unit, said method comprising the steps of:

detecting the number of bit error corrections in the output of said coding unit during a measurement period set externally;
  detecting a synchronized state based on the number of bit error corrections detected by said bit error corrections detecting unit and a threshold;
  calculating the threshold based on a value of the measurement period.

Note 23: A method for controlling synchronism in a viterbi decoder, said viterbi decoder comprising a decoding unit which decodes input data, a coding unit which codes the data decoded by said decoding unit, said method comprising the steps of:

detecting the number of bit error corrections in the output of said coding unit during a measurement period set externally;
  detecting a synchronized state based on the number of bit error corrections detected by said bit error corrections detecting unit and a threshold;
  determining the threshold by setting a ratio between the measurement period and the threshold as the scaling value.

Note 24: The method for controlling synchronism according to note 23, wherein a plurality of scaling values are used as the threshold.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A viterbi decoder comprising:
  a decoding unit which decodes input data;
  a coding unit which codes the input data decoded by said decoding unit and produces a coded output;
  a bit error correction detecting unit which detects and counts bit error corrections in the coded output of said coding unit during a measurement period set externally;
  a synchronized state detecting unit which detects a synchronized state based on (i) the bit error corrections detected and counted by said bit error correction detecting unit and (ii) a threshold; and
  a threshold detecting unit which determines the threshold based on the number of bit error corrections detected by said bit error correction detecting unit during a threshold detection period that includes the measurement period.

2. The viterbi decoder according to claim 1, wherein the threshold determination unit is operated J times (where J is an integer) to produce J candidate thresholds and the smallest of the J candidate thresholds is determined as the threshold.

3. A viterbi decoder comprising:
  a decoding unit which decodes input data;
  a coding unit which codes the input data decoded by said decoding unit and produces a coded output;
  a bit error correction detecting unit which detects and counts bit error corrections in the coded output of said coding unit during a measurement period set externally;
  a synchronized state detecting unit which detects a synchronized state based on (i) the bit error corrections detected and counted by said bit error correction detecting unit and (ii) a threshold; and
  a threshold determining unit which, when said viterbi decoder has 1 synchronous state and L asynchronous states, counts the bit error corrections (L+1) times during the measurement period prior to a synchronizing operation of said viterbi decoder, and determines the threshold based on the bit error corrections detected and counted (L+1) times by said bit error correction detecting unit.

4. The viterbi decoder according to claim 3, wherein the smallest number of bit error corrections detected and counted during L asnchronous states is determined by said threshold determining unit.

5. The viterbi decoder according to claim 4 wherein the threshold determining unit comprises:
  a threshold selecting unit which selects the second smallest number of the bit error corrections from the bit error corrections detected and counted (L+1) times; and
  an operating mode determining unit which determines whether an operating mode is correct based on the threshold and a minimum number of bit error corrections.

6. The viterbi decoder according to claim 4 wherein the threshold determining unit comprises:

a threshold selecting circuit which sequentially compares the number of the bit error corrections in selecting the second smallest number of the bit error corrections from the bit error corrections detected and counted (L+1) times; and an operating mode determining unit which determines whether the operating mode is correct based on the threshold and a minimum number of bit error corrections.

7. The viterbi decoder according to claim 3, wherein the threshold determination unit is operated J times (where J is an integer) to produce J candidate thresholds and the smallest of the J candidate thresholds is determined as the threshold.

8. The viterbi decoder according to claim 3, wherein the threshold determining unit produces an output that is scaled and used as the threshold.

9. A method for controlling synchronism in a viterbi decoder, said viterbi decoder comprising a decoding unit which decodes input data, and a coding unit which codes the input data decoded by said decoding unit and produces a coded output, the method comprising:

- detecting and counting the number of bit error corrections in the coded output of said coding unit during a measurement period set externally;
- detecting a synchronized state based on (i) the number of bit error corrections detected and counted and (ii) a threshold; and
- detecting the number of bit error corrections in the coded output of said coding unit during a pre-set threshold detection period that includes the measurement period, and determining the threshold based on the number of bit error corrections detected.

10. The method for controlling synchronism according to claim 9, including repeatedly determining the threshold J times (where J is an integer) to produce J candidate thresholds and using the smallest of the J candidate thresholds as the threshold.

* * * * *